(12) United States Patent
Iida

(10) Patent No.: US 9,355,890 B2
(45) Date of Patent: May 31, 2016

(54) METHOD OF MANUFACTURING SEMICONDUCTOR DEVICE AND SEMICONDUCTOR DEVICE

(71) Applicant: Renesas Electronics Corporation, Kawasaki-shi (JP)

(72) Inventor: Tetsuya Iida, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 216 days.

(21) Appl. No.: 13/748,873

(22) Filed: Jan. 24, 2013

(65) Prior Publication Data

US 2013/0207228 A1 Aug. 15, 2013

(30) Foreign Application Priority Data

Feb. 15, 2012 (JP) .................................. 2012-030498

(51) Int. Cl.

| H01L 21/8242 | (2006.01) |
|---|---|
| H01L 21/762 | (2006.01) |
| H01L 29/06 | (2006.01) |
| H01L 21/306 | (2006.01) |
| H01L 21/84 | (2006.01) |
| H01L 27/12 | (2006.01) |

(52) U.S. Cl.
CPC .... *H01L 21/76283* (2013.01); *H01L 21/30625* (2013.01); *H01L 21/76248* (2013.01); *H01L 21/84* (2013.01); *H01L 27/1207* (2013.01); *H01L 29/0649* (2013.01); *H01L 2924/0002* (2013.01)

(58) Field of Classification Search
CPC .............................. H01L 21/764; H01L 21/762
USPC ..................................................... 438/241–248
See application file for complete search history.

(56) References Cited

U.S. PATENT DOCUMENTS

| 8,129,790 B2 | 3/2012 | Sudo |
|---|---|---|
| 2010/0006973 A1 | 1/2010 | Kohyama |

FOREIGN PATENT DOCUMENTS

| JP | 2009-267375 A | 11/2009 |
|---|---|---|
| JP | 2010-004016 A | 1/2010 |

*Primary Examiner* — Samuel Gebremariam
(74) *Attorney, Agent, or Firm* — McGinn IP Law Group, PLLC

(57) ABSTRACT

Disclosed is a miniaturized semiconductor device having an SOI layer, in which: a silicon layer is formed over a semiconductor substrate via an BOX film; after the silicon layer is patterned by using a nitride film as a mask, an insulating film covering the surface of each of the nitride film, the silicon layer, and the BOX film is formed; subsequently, an opening, which penetrates the insulating film and the BOX film and which exposes the upper surface of the semiconductor substrate, is formed, and an epitaxial layer is formed in the opening; subsequently, the SOI region and a bulk silicon layer are formed over the semiconductor substrate by flattening the upper surface of the epitaxial layer with the use of the nitride film as an etching stopper film.

19 Claims, 19 Drawing Sheets

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2012-030498 filed on Feb. 15, 2012 including the specification, drawings and abstract is incorporated herein by reference in its entirety.

BACKGROUND

The present invention relates to both a method of manufacturing a semiconductor device and a semiconductor device, and in particular, to a technique that is effective when applied to a method of manufacturing a semiconductor device using an SOI (Silicon On Insulator) substrate and the semiconductor device.

Semiconductor devices each using an SOI substrate are currently used as a semiconductor device in which occurrence of a parasitic capacitance can be suppressed. The SOI substrate is a substrate in which a BOX (Buried Oxide) film (embedded oxide film) is formed over a supporting substrate comprised of high-resistance Si (silicon), etc., and a thin layer (silicon layer) mainly including Si is formed over the BOX film. When a MOSFET (Metal Oxide Semiconductor Field Effect Transistor: MOS type field effect transistor) is formed over the SOI substrate, a parasitic capacitance that may be caused in a diffusion region formed in the silicon layer can be reduced. Accordingly, when a semiconductor device is manufactured by using the SOI substrate, the semiconductor device can be expected to be improved in integration density and operating speed and to be free of latch-up, etc.

In Japanese Unexamined Patent Publication No. 2010-4016, it is described that both an SOI region, in which a BOX film and a silicon layer are formed over a substrate, and a bulk silicon region, in which the upper surface of the substrate is exposed by opening the BOX film and the silicon layer to form a sidewall oxide over the side surface of the opening and an epitaxial layer is then formed in the opening, are formed.

Herein, the silicon layer in the SOI region and the epitaxial layer are insulated from each other by the sidewall oxide formed by being deposited over the substrate. The distance between the silicon layer in the SOI region and the epitaxial layer is equal to the thickness of the sidewall oxide.

In Japanese Unexamined Patent Publication No. 2009-267375, it is described that a bulk region and an SOI region, which are separated from each other by an STI (Shallow Trench Isolation), are formed over a substrate. Herein, an SOI layer is formed over the substrate via an oxide, and the upper surface of the substrate is exposed by opening the oxide and the SOI layer to form a sidewall spacer over the side wall of the opening, and an epitaxial layer is then formed in the opening. Thereafter, the STI is formed between the SOI layer and the epitaxial layer by etching the two layers with the use of a silicon nitride layer as a mask.

SUMMARY

In a circuit to be used in a mobile phone, both an IC (Integrated Circuit) including a semiconductor element that provides a merit when formed over an SOI layer, the IC being used, for example, in switching, etc., and an IC including a semiconductor element that provides a merit when formed over a bulk silicon layer, the IC being used, for example, as a Power Amplifier, are sometimes formed. It is considered that these ICs are respectively formed into semiconductor chips separate from each other and the semiconductor chips are coupled to each other by wirings, such as wires.

However, if an IC formed over the SOI substrate and that formed over the bulk silicon substrate are respectively formed into semiconductor chips separate from each other, the number of semiconductor chips is increased, and hence there are problems that it becomes difficult to miniaturize the device and manufacturing cost is increased.

The aforementioned and other purposes and new features of the present invention will become clear with reference to the description and accompanying drawings of the present specification.

Of the preferred embodiments disclosed in the present application, typical embodiments can be briefly outlined as follows.

In a method of manufacturing a semiconductor device according to an embodiment, after a silicon layer, which has been formed over a substrate via a BOX film, is patterned by using a nitride film as a mask, an insulating film covering the surface of each of the nitride film, the silicon layer, and the BOX film is formed, and an epitaxial layer is then formed in an opening that penetrates the insulating film and the BOX film and that exposes the upper surface of the substrate.

Ina semiconductor device according to another embodiment, a silicon layer formed over a substrate via a BOX film and an epitaxial layer formed to be in contact with the upper surface of the substrate are spaced apart from each other by 5 µm or more.

According to an embodiment disclosed in the present application, the performance of a semiconductor device can be improved. In particular, a semiconductor device can be miniaturized.

DETAILED DESCRIPTION

Figure 1:
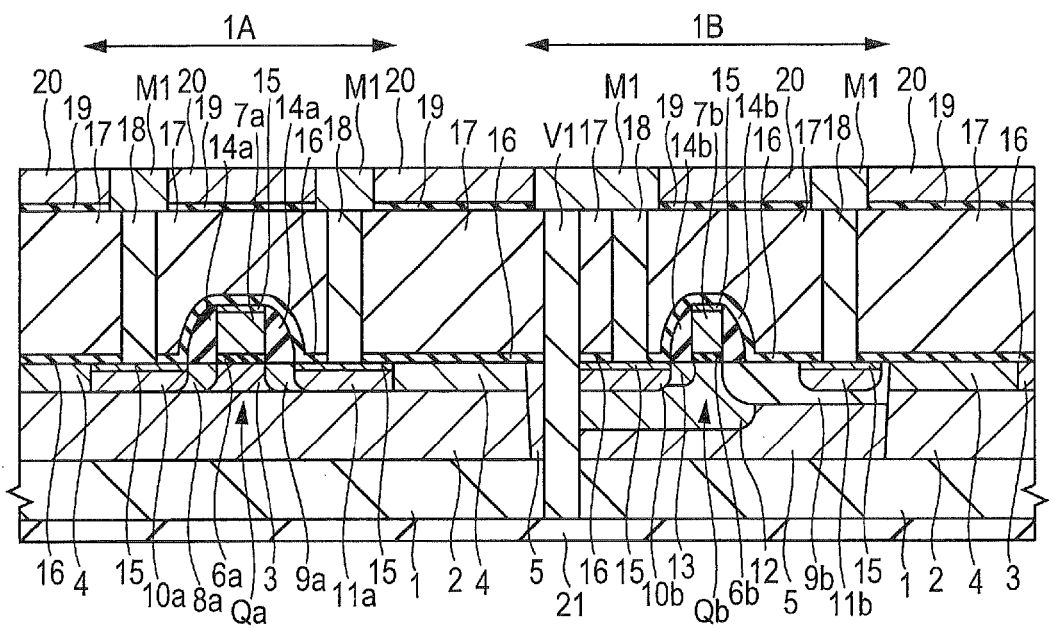
FIG. 1 is a sectional view of a semiconductor device according to First Embodiment of the present invention.

Hereinafter, preferred embodiments of the present invention will de described in detail based on the accompanying drawings. In each of the views for explaining the embodiments, members having the same functions as each other are denoted with the same reference numerals, and duplicative explanations thereof will be omitted. In addition, in the following embodiments, the description of the same or similar parts will not be repeated in principle, unless particularly needed.

(First Embodiment)

An example of the structure of a semiconductor device including a MOS type field effect transistor (hereinafter, simply referred to as a MOSFET), according to First Embodiment 1 of the present invention, will be described with reference to FIG. 1. FIG. 1 is a sectional view of a semiconductor device including both a MOSFET formed in an SOI region and that formed in a bulk silicon region.

An SOI region 1A is illustrated on the left side of FIG. 1, and a bulk silicon region 1B is illustrated on the right side thereof. The SOI region 1A means a region where a silicon layer 3 is formed over a semiconductor substrate 1 via a BOX film 2 that is an oxide insulating film. The bulk silicon region 1B means a region where an epitaxial layer 5 including silicon (SI) is formed over the semiconductor substrate 1, different from the SOI region 1A. Accordingly, the BOX film 2, an insulating film, is formed between a MOSFETQa formed over the silicon layer 3 in the SOI region 1A and the semiconductor substrate 1, but an insulating film is not formed between an MOSFETQb formed over the epitaxial layer 5 in the bulk silicon region 113 and the semiconductor substrate 1. The epitaxial layer 5 is formed at a height the same as that of a laminated film comprised of the silicon layer 3 and the BOX film 2, and has a thickness larger than that of the silicon layer 3.

The semiconductor device according to the present embodiment includes a substrate and a MOSFET formed over the substrate, which form one semiconductor chip mounted over a printed circuit board in a mobile phone. A circuit in a mobile phone includes a power amplifier IC, a switching IC, an IPD (Integrated Passive Device), and a control IC, etc., and as examples, an n-channel type MOSFETQa that forms a switching IC is illustrated in the SOI region 1A in FIG. 1, and a MOSFETQb that forms a power amplifier IC is illustrated in the bulk silicon region 1B. Herein, the MOSFETQb is an LDMOSFET (Laterally Diffused MOSFET) in which a drain region is formed to be spaced apart from a gate electrode and the impurities that form the drain region are horizontally diffused.

Herein, the power amplifier IC means a circuit having a power amplifying function by which a signal to be transmitted outside a mobile phone is amplified. The signal amplified by the power amplifier IC is sent to an antenna via the switching IC and transmitted outside. The switching IC means a circuit for performing on-off switching of an electrical circuit to send the signal amplified by the power amplifier IC to the antenna, not to the control IC. The control IC means a circuit that processes an input (received) signal transmitted sequentially via the antenna and the switching IC and that controls an operating potential of the power amplifier, the switching IC, or the like, and it also controls other devices, such as a display of the mobile phone. The IPD means a device in which capacitors, inductors, resistors, or the like, which have been formed by a high-density packaging technology for passive components, are formed and integrated over a semiconductor substrate by using a semiconductor process.

A switching IC or a control IC is particularly required to have a signal processing function at high speed, and it becomes possible to increase an integration density of respective elements for each circuit by forming the elements in the SOI region. With such a structure, an effect of reducing power consumption or that of improving operating speed, or the like, can be obtained. These advantages can be obtained because a current flowing through the switching IC or the control IC is small That is, when a MOSFET that forms a circuit formed in the SOI region works, a current flows with a channel being formed in a silicon film (SOI layer) formed over the BOX film in the SOI region. However, the thickness of the silicon layer is as small as, for example, approximately 50 nm, and hence there is the fear that: if a current flowing through the silicon layer becomes large, the MOSFET may be broken down and the circuit may not work properly. Accordingly, it is needed to form a MOSFET, which forms a power amplifier IC or an IPD that needs a large current, over the bulk silicon film that does not include an SOI structure and that has a large thickness. Herein, the switching IC and the control IC are digital circuits (logic circuits), while the power amplifier IC is a high-frequency analog circuit. The high-frequency described herein means a frequency of 10 kHz or more.

Hereinafter, the structure of the semiconductor device according to the present embodiment will be described in detail.

As illustrated in FIG. 1, the semiconductor device according to the present embodiment has a semiconductor substrate 1 comprised of high-resistance silicon having a resistance value of 750 Ωcm or more. The semiconductor substrate 1 is comprised of non-doped silicon and has a thickness within a range of, for example, 50 to 70 μm. The high-resistance semiconductor substrate 1 is adopted in order to prevent: that a noise may be caused, by capacitive coupling, in a high-frequency signal flowing through an element over the semiconductor substrate 1; that the energy of the high-frequency signal may be lost by the capacitive coupling; that an eddy current may be caused in a coil (inductor) over the semiconductor substrate 1; or the like.

A back surface electrode 21, which is in contact with the lower surface (back surface) of the semiconductor substrate 1, is formed in the lower portion of the substrate 1. The back surface electrode 21 is a laminated metal film formed by laminating sequentially, for example, Ni (nickel), Ti (titanium), and Au (gold) from the back surface side of the semiconductor substrate 1, and herein is electrically coupled to the source region of the MOSFETQb in the bulk silicon region 1B. As an electrode to be coupled to the source region, a source electrode that is pulled out over the MOSFET by using a laminated wiring, not a back surface electrode, is considered; however, by making a back surface electrode serve as a source electrode, it can be prevented that a capacitance may be caused between the wirings over the MOSFET.

The BOX film (embedded oxide film) 2 comprised of a silicon oxide film having a thickness within a range of approximately 400 to 2000 nm is formed over the semiconductor substrate 1 in the SOI region 1A, and the silicon layer 3 having a thickness of approximately 50 nm is formed over the BOX film 2. The n-channel type MOSFETQa including a diffusion layer formed in the silicon layer 3 is formed over the silicon layer 3. The MOSFETQa has both a gate electrode 7a formed over the silicon layer 3 via a gate insulating film 6a and a source and drain region formed in the silicon layer 3 so as to sandwich the gate electrode 7a. A sidewall 14a comprised of a silicon oxide film, etc., is formed over the side wall of the gate electrode 7a. The thickness of the gate insulating film 6a is within a range of 5 to 7 nm, and the gate length of the gate electrode 7a is within a range of 0.15 to 5 μm, and the width of the sidewall 14a in the gate length direction of the gate electrode 7a is within a range of 50 to 300 nm.

The silicon layer 3 immediately below the gate electrode 7a is a layer that serves as a channel region of the MOSFETQa, and a low-concentration of p-type impurities (e.g., B (boron)) are introduced therein. Extension regions 8a and 9a, in each of which a relatively low-concentration of n-type impurities (e.g., As (arsenic)) are introduced, are formed in the left and right silicon layers 3 in the gate length direction of the gate electrode 7a, respectively. Also, diffusion layers 10a and 11a, in each of which a high-concentration of n-type impurities (e.g., As (arsenic)) are introduced, are formed in the gate length direction so as to sandwich the extension regions 8a and 9a and the silicon layer 3 immediately below the gate electrode 7a.

That is, in the gate length direction, the extension region 8a and the diffusion layer 10a are sequentially formed outside one side of the silicon layer 3 immediately below the gate electrode 7a, and the extension region 9a and the diffusion layer 11a are sequentially formed outside the other side thereof. The extension region 8a and the diffusion layer 10a adjacent to the extension region 8a form the source region of the MOSFETQa, while the extension region 9a and the diffusion layer 11a form the drain region of the MOSFETQa. The MOSFETQa has the source region, the drain region, and the gate electrode 7a.

Because the BOX film 2 and the silicon layer 3 are opened in the bulk silicon region 1B, the two are not formed over the semiconductor substrate 1. The epitaxial layer 5, which is in contact with the upper surface of the semiconductor substrate 1, is embedded in the opening of the BOX film 2 and the silicon layer 3. The epitaxial layer 5 is mainly comprised of silicon (SI) and includes a low-concentration of p-type impurities (e.g., B (boron)). Alternatively, the epitaxial layer 5 may be a non-doped layer in which an impurity is not introduced.

The side wall of the epitaxial layer 5 is in contact with the BOX film 2, but is not in contact with the silicon layer 3, and an element isolation region 4 including a silicon oxide film is formed over the BOX film 2 and between the silicon layer 3 and the epitaxial layer 5. The element isolation region 4 is formed by an STI process, not by a LOCOS (Local Oxidization of Silicon) process. The element isolation region 4 is formed, when viewed planarly, so as to surround the silicon layer 3 and the epitaxial layer 5, thereby isolating respective elements from each other. Herein, the silicon layer 3 and the epitaxial layer 5 are spaced apart from each other by 5 μm or more.

A p-type well 12, in which a relatively low-concentration of p-type impurities (e.g., B (boron)) are introduced, is formed over the upper surface of the epitaxial layer 5. The n-channel type MOSFETQb including an impurity diffusion layer formed in the epitaxial layer 5 is formed over the epitaxial layer 5 over which the p-type well 12 is formed. The MOSFETQb has both a gate electrode 7b formed over the epitaxial layer 5 via a gate insulating film 6b and a source and drain region formed over the upper surface of the epitaxial layer 5 so as to sandwich the gate electrode 7b. A sidewall 14b comprised of a silicon oxide film, etc., is formed over the side wall of the gate electrode 7b. The thickness of the gate insulating film 6b is within a range of 8 to 12 nm, and the gate length of the gate electrode 7b is within a range of 0.18 to 0.25 μm, and the width of the sidewall 14b in the gate length direction of the gate electrode 7b is within a range of 50 to 300 nm.

An area near to the upper surface of the epitaxial layer 5 immediately below the gate electrode 7b is a region that serves as a channel region of the MOSFETQb. Diffusion layers 10b and 11b, in each of which a relatively high-concentration of n-type impurities (e.g., As (arsenic)) are introduced, are formed over the upper surfaces of the left and right epitaxial layers 5 in the gate length direction of the gate electrode 7b, respectively. Herein, the diffusion layer 10b is formed near to the gate electrode 7b, while the diffusion layer 11b is formed to be far therefrom, and the distance between the diffusion layer 11b and the gate electrode 7b is longer than that between the diffusion layer 10b and the gate electrode 7b.

An extension region 9b, in which a concentration of n-type impurities (e.g., As (arsenic)) are introduced, the concentration being lower than that in the diffusion layer 11b, is formed over the upper surface of the epitaxial layer 5 between the epitaxial layer 5 immediately below the gate electrode 7b and the diffusion layer 11b. The extension region 9b is a semiconductor layer whose junction depth is larger than that of the diffusion layer 11b and smaller than that of the p-type well 12. The diffusion layer 11b is covered with the extension region 9b in the epitaxial layer 5. The p-type well 12 is formed over the upper surface of the epitaxial layer 5 immediately below the gate electrode 7b, and the p-type well 12 and the extension region 9b are adjacent to each other. In order to reduce the electric field of the MOSFETQb, it is needed to drive the p-type well 12 and the extension region 9b into a region somewhat deep from the upper surface of the epitaxial layer 5. Accordingly, when it is intended that an element of an analog circuit that needs a large current, such as the MOSFETQb, is formed in the SOI region 1A, there is the fear that, because the thickness of the silicon layer 3 is too small, the junction depth between a p-type well and an extension region becomes small and an electric field becomes large, thereby possibly causing a malfunction in the MOSFET. Accordingly, it is needed to form the MOSFETQb, which forms the power amplifier IC, over a semiconductor layer having a large thickness, like the epitaxial layer 5.

A halo region 13, in which a relatively high-concentration of p-type impurities (e.g., B (boron)) are introduced, is formed in the epitaxial layer 5 near to the end of the diffusion layer 10b on the gate electrode 7b side. The halo region 13 is a semiconductor region that is formed to prevent occurrence of a leak current between a source and drain, and is formed by driving a conductive impurity, different from that in the source and drain region, into the epitaxial layer 5.

Herein, the diffusion layer 10b forms the source region of the MOSFETQb, and the extension region 9b and the diffusion layer lib form the drain region thereof. The MOSFETQb includes the gate electrode 7b and the diffusion layers 10b and 11b. Thus, the MOSFETQb is an LDMOSFET in which: the drain region is formed at a position farther from the gate electrode 7b than that of the source region; the extension region 9b having an impurity concentration lower than that in the diffusion layer lib is included between the gate electrode 7b and the diffusion layer 11b; and the impurities are diffused by vertically changing the shades of the impurities over the upper surface of the epitaxial layer 5. The LDMOSFET is a field effect transistor in which, by enlarging the space between a gate electrode and a drain electrode, the electric field strength between a source and drain region can be reduced and the withstand voltage thereof can be enhanced.

The respective heights of the upper surfaces of the silicon layer 3, the extension regions 8a, 9a, and 9b, the diffusion layers 10a, 10b, 11a, and 11b, and the element isolation region 4, which are illustrated in FIG. 1, are approximately the same as each other. A silicide layer 15 comprised of, for example, CoSi (cobalt silicon) is formed over the upper surface of each of the gate electrodes 7a and 7b and the diffusion layers 10a, 10b, 11a, and 11b. An etching stopper film 16 and an interlayer insulating film 17 are sequentially formed over the semiconductor substrate 1 so as to cover the element isolation region 4, the MOSFETs Qa and Qb, and the silicide layer 15. The etching stopper film 16 is comprised of, for example, a thin silicon nitride film and the interlayer insulating film 17 is comprised of, for example, a silicon oxide film.

A contact plug 18 penetrating the etching stopper film 16 and the interlayer insulating film 17 is formed, via the silicide layer 15, immediately over each of the gate electrodes 7a and 7b and the diffusion layers 10a, 10b, 11a, and 11b. The contact plug 18 is comprised of, for example, W (tungsten). A through via (TSV; Through Silicon Via) V1 is formed in the bulk silicon region 1B, the through via V1 penetrating the interlayer insulating film 17, the etching stopper film 16, the epitaxial layer 5, and the semiconductor substrate 1 to reach the back surface electrode 21. The through via V1 is formed from the upper surface of the interlayer insulating film 17 to the bottom of the semiconductor substrate 1. In the direction perpendicular to the major surface of the semiconductor substrate 1, the length of the through via V1 is 100 μm or less. In FIG. 1, the contact plug 18 coupled to each of the gate electrodes 7a and 7b is not illustrated.

The upper surface of the through via V1 is in contact with one bottom of a plurality of wirings M1 formed over the interlayer insulating film 17, and is electrically coupled to the diffusion layer 10b, the source region of the MOSFETQb, via the wirings M1 and the contact plug 18. The lower surface of the through via V1 is coupled to the back surface electrode 21. That is, the back surface electrode 21 is electrically coupled to the diffusion layer 10b, so that the back side electrode 21 functions as the source electrode of the MOSFETQb.

A wiring M1 is a damascene wiring that penetrates the etching stopper film 19 and the interlayer insulating film 20, which are sequentially formed over the interlayer insulating film 17, and that is embedded in a wiring groove by which the upper surface of each of the interlayer insulating film 17, the contact plug 18, and the through via V1 is exposed. The wiring M1 is mainly comprised of copper (Cu). The wirings M1 are formed to be in contact with the upper surfaces of a plurality of the contact plugs 18, respectively.

As stated above, in the semiconductor device according to the present embodiment, the SOI region LA and the bulk silicon region 1B are provided over one semiconductor substrate 1; the MOSFETQa that forms a switching IC is formed over the silicon layer 3 in the SOI region 1A; and the MOSFETQb that forms a power amplifier IC is formed over the epitaxial layer 5 in the bulk silicon region 1B. Accordingly, the MOSFETQa having a low withstand voltage, which can provide, when formed over the SOI layer, an effect of being miniaturized, that of improving operating speed, and that of reducing power consumption, etc.; and the MOSFETQb having a high withstand voltage, which is suitable for being formed over the epitaxial layer 5 having a thickness larger than that of the silicon layer 3, can be both formed over the semiconductor substrate 1.

Accordingly, an element that provides a merit when formed in the SOI region, and an element that provides a merit when formed in the bulk silicon region, can be mounted together over one semiconductor chip, and hence a semiconductor device can be further miniaturized, in comparison with the case where these elements are formed over semiconductor chips separate from each other.

In a device in which an SOI region and a bulk silicon region are formed over one semiconductor substrate, when a digital circuit is formed in each of the two regions, there is no problem if the distance between the two regions is less than 5 μm. However, when the MOSFETQa, which forms a digital circuit, is formed in the SOI region 1A and the MOSFETQ, which forms an analog circuit, is provided in the bulk silicon region 1B, as illustrated in FIG. 1, it is needed to make the distance between the two regions to be 5 μm or more.

This is because, if the space between the SOI region and the bulk silicon region is small, there is the fear that an element in the SOI region may not work properly because of a noise, etc., the noise being caused by an influence from a power amplifier IC driven with a current larger than that for a switching IC.

For example, a method is considered in which: after an oxide insulating film is formed over the internal wall of a groove formed in an SOI substrate by using a CVD (Chemical Vapor Deposition) process, etc., an epitaxial layer is formed from the bottom of the groove by using an epitaxial growth process; and an SOI layer over the SOI substrate and the epitaxial layer are insulated from each other by the oxide insulating film over the side wall of the groove. In a semiconductor device having such a structure, however, the space between the SOI layer and the epitaxial layer is equal to the thickness of the oxide insulating film, and hence it is difficult to form the two layers at positions 5 µm or more far from each other. Accordingly, there is the fear that, if a digital circuit is formed over the SOI layer and an analog circuit is formed over the epitaxial layer, a malfunction may be caused in the digital circuit over the SOI layer.

In the semiconductor device according to the present embodiment, the distance between the silicon layer 3 in the SOI region 1A and the epitaxial layer 5 in the bulk silicon region 1B is made to be 5 µm or more, and hence the reliability of the semiconductor device can be improved.

Although it has been described that, in the present embodiment, the MOSFETQa formed in the SOI region illustrated in FIG. 1 is an element that forms a switching IC, a semiconductor element that forms an analog circuit is to be formed in the SOI region 1A, in addition to a digital circuit, such as a switching IC. An element in the digital circuit to be formed in the SOI region 1A is not limited to a switching IC, but may be an element that forms a control IC, or the like. Although it has been described that the MOSFETQb formed in the bulk silicon region 1B is an element that forms a power amplifier IC, an element to be formed in the bulk silicon region 1B may be an element that forms an IPD, or the like, which is an analog circuit as well as a power amplifier IC.

Although two n-channel type MOSFETs have been exemplified in FIG. 1, the MOSFET to be formed in each of the SOI region 1A and the bulk silicon region 1B may be a p-channel type MOSFET. Also, the MOSFET to be formed in the bulk silicon region 1B is not limited to an asymmetrical FET like an LDMOSFET, but may be a MOSFET having a symmetrical shape with respect to a gate electrode. The MOSFET to be formed in the bulk silicon region 1B may not be coupled to the back surface electrode 21 by using the through via V1.

Subsequently, steps for manufacturing a semiconductor device according to the present embodiment will be described with reference to the accompanying drawings. FIGS. 2 to 16 are sectional views while a semiconductor device according to an embodiment of the present invention is being manufactured, the semiconductor device being, for example, one having an n-channel type MOSFET in each of an SOI region and a bulk silicon region over one substrate. The SOI region 1A is illustrated on the left side of each of the sectional views of FIGS. 7 to 16, while the bulk silicon region 1B is illustrated on the right side thereof.

Figure 2:
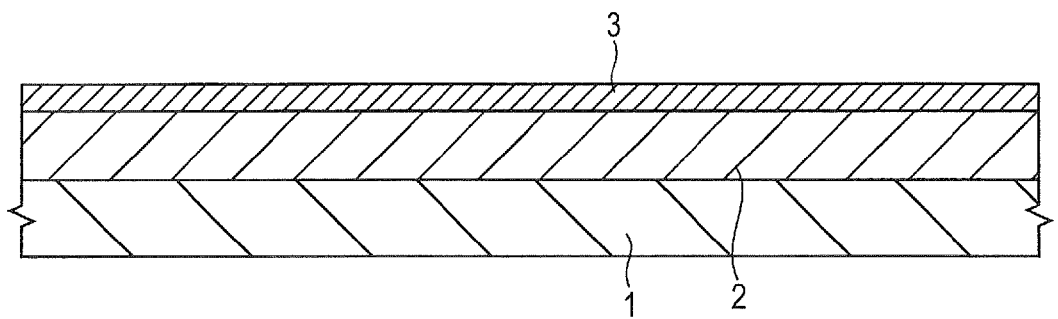
FIG. 2 is a sectional view illustrating a method of manufacturing the semiconductor device according to First Embodiment of the invention.

As illustrated in FIG. 2, the semiconductor substrate 1 over which the BOX film 2 and the silicon layer 3 are laminated is first provided. The semiconductor substrate 1 is a high-resistance supporting substrate having a resistance value of 750 Ωcm, which is comprised of Si (silicon). A p-type or n-type impurity is not introduced, but oxygen ($O_2$) may be introduced. The BOX film 2 is a silicon oxide film, and the silicon layer 3 is a layer comprised of single crystal silicon having a resistance within a range of approximately 1 to 10 Ωcm.

An SOI substrate comprised of the semiconductor substrate 1, the BOX film 2, and the silicon layer 3 can be formed by a SIMOX (Silicon Implanted Oxide) process in which: $O_2$ (oxygen) is ion implanted, with high energy, into the major surface of the semiconductor substrate 1 comprised of Si (silicon); and the Si (silicon) and the oxygen are bound together by a subsequent heat treatment, so that the embedded oxide film (BOX film) 2 is formed at a position slightly deeper than the surface of the semiconductor substrate 1. The SOI substrate can also be formed by a process in which: the semiconductor substrate 1, the surface of which an oxide film is formed over, and another semiconductor substrate comprised of Si (silicon) are adhered and laminated together by applying high-temperature and pressure; and one of the silicon layers is then polished to make the thickness of the laminated object to be small.

Figure 3:
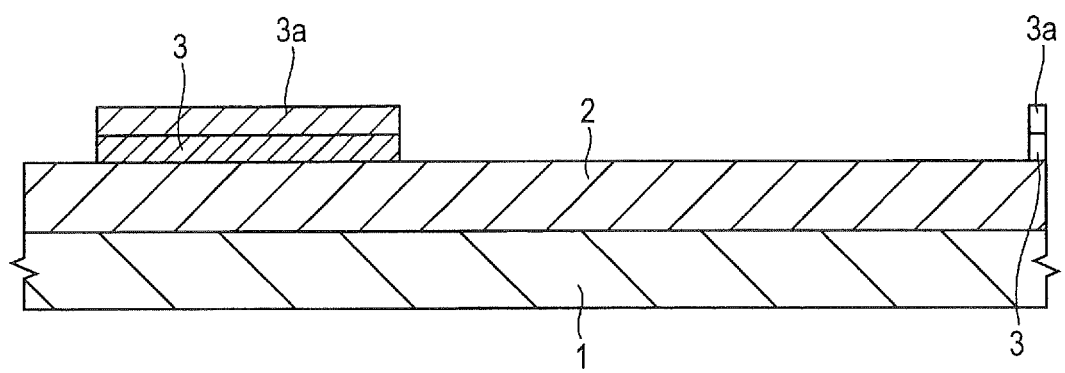
FIG. 3 is a sectional view illustrating the method of manufacturing the semiconductor device following FIG. 2.

Subsequently, as illustrated in FIG. 3, after a silicon nitride film 3a is formed over the silicon layer 3 by using, for example, a CVD process, the silicon nitride film 3a is partially opened by using a photolithography technique and a dry etching process, so that the upper surface of the silicon layer 3 is exposed. The silicon nitride film 3a is a hard mask to be used in a later step for patterning the silicon layer 3, and also is a film to be used as a stopper film in the subsequent polishing step. The thickness of the film is, for example, 50 nm. Part of the silicon layer 3 is then opened by etching the silicon layer 3 with the use of the silicon nitride film 3a as a hard mask, so that the upper surface of the BOX film 2 is exposed.

Figure 4:
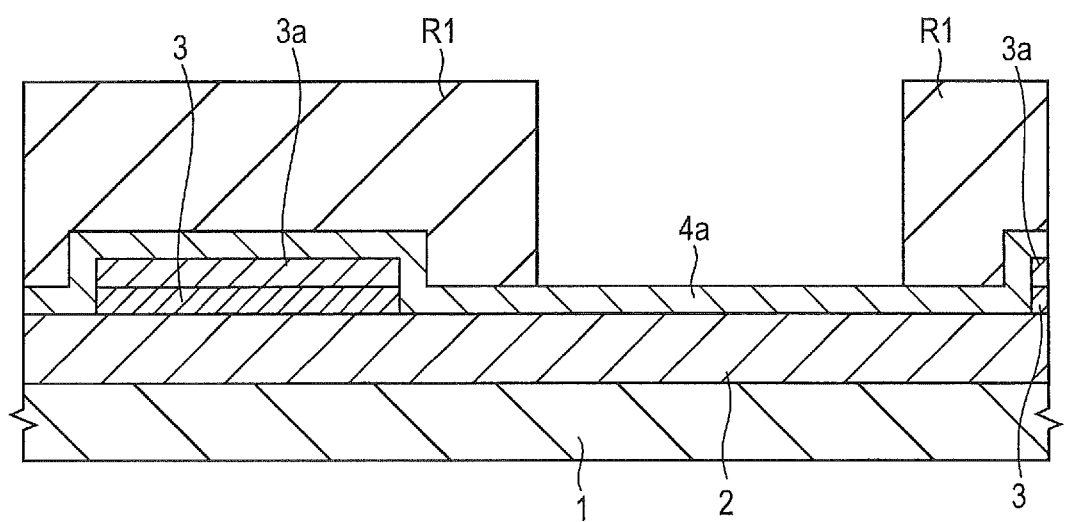
FIG. 4 is a sectional view illustrating the method of manufacturing the semiconductor device following FIG. 3.

Subsequently, as illustrated in FIG. 4, a silicon oxide film 4a is formed by using, for example, a CVD process, over the whole surface of the semiconductor substrate 1 so as to cover the upper surface of the BOX film 2 exposed from the silicon layer 3, the side surface of the silicon layer 3 exposed from the silicon nitride film 3a, and the silicon nitride film 3a. The thickness of the silicon oxide film 4a is, for example, within a range of 50 to 100 nm, and it is preferable to make the thickness thereof larger than that of the silicon layer 3.

Subsequently, a photoresist film RI having a desired pattern is formed by coating the film R1 over the whole surface of the semiconductor substrate 1 and then by exposing and developing the film R1. Herein, the opening of the photoresist film R1 is formed inside the opening of the silicon nitride film 3a and inside the opening of the silicon layer 3, so that the upper surface of the silicon oxide film 4a is exposed. Accordingly, the opening of the photoresist film R1 becomes smaller than that of the silicon layer 3. That is, the opening of the photoresist film R1 is formed at a position that is located inside the opening of the silicon layer 3 and that is far from the internal wall of the opening of the silicon layer 3 by a distance larger than or equal to the thickness of the silicon oxide film 4a.

Figure 5:
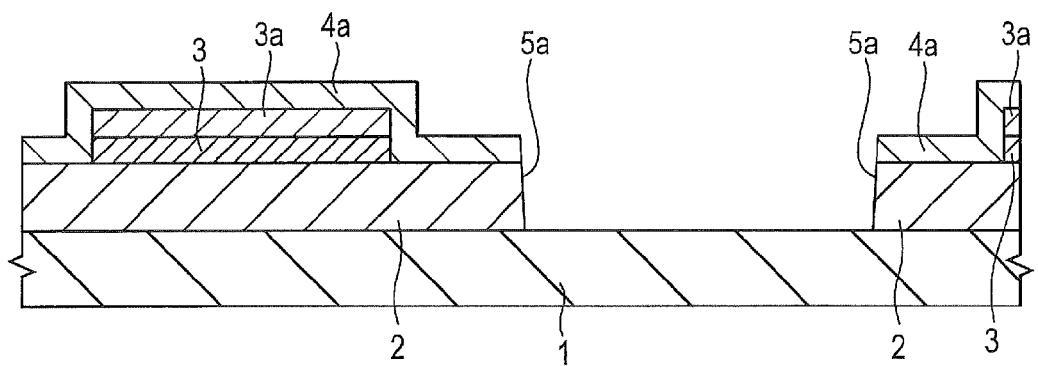
FIG. 5 is a sectional view illustrating the method of manufacturing the semiconductor device following FIG. 4.

Subsequently, as illustrated in FIG. 5, an opening 5a is formed by removing the silicon oxide film 4a and the BOX film 2 with a dry etching process using the photoresist film R1 as a mask, so that the upper surface of the semiconductor substrate 1 is exposed. Because the opening 5a is formed by performing anisotropic etching on an area immediately below the opening of the photoresist film R1 with the use of the photoresist film R1 as a mask, the opening 5a is smaller than that of the silicon layer 3. Thereafter, the photoresist film R1 is removed.

Figure 6:
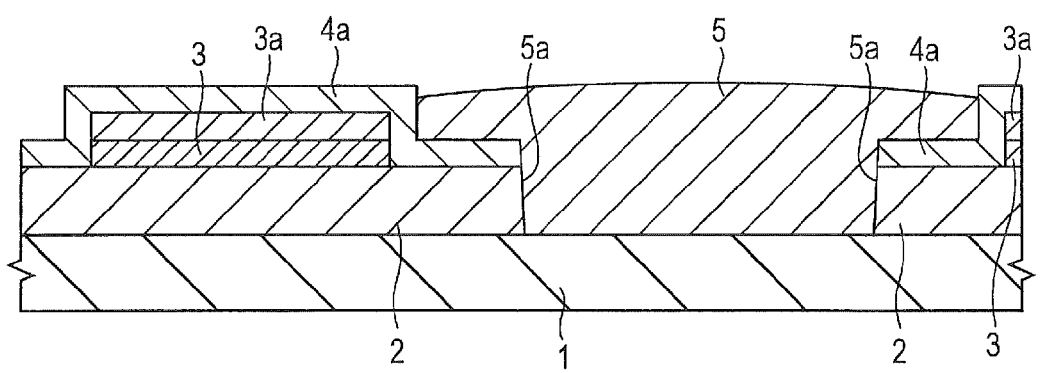
FIG. 6 is a sectional view illustrating the method of manufacturing the semiconductor device following FIG. 5.

Subsequently, as illustrated in FIG. 6, the epitaxial layer 5 is formed in the opening 5a by being selectively grown from the upper surface of the semiconductor substrate 1 with an epitaxial growth process. The epitaxial layer 5 is formed to fill the opening 5a and to reach a height the same as that of the silicon nitride film 3. The epitaxial layer 5 is made to be a low-concentration p-type semiconductor region by introducing a p-type impurity (e.g., B (boron)) along with a material gas while the epitaxial layer 5 is being formed, or by ion implanting a p-type impurity (e.g., B (boron)) after the epitaxial layer 5 has been formed, not while the epitaxial layer 5 is being formed. Because the epitaxial layer 5 is formed in the opening 5a formed inside the opening of the silicon layer 3, the epitaxial layer 5 is formed, when viewed planarly, inside the silicon layer 3 via the silicon oxide film 4a.

In this case, the epitaxial layer 5 is embedded to the height of the upper surface of the silicon layer 3. It is ideal that the upper surface of the epitaxial layer 5 is located higher than the upper surface of the silicon layer 3 and lower than the upper surface of the silicon nitride film 3a. This is because, if the upper surface of the epitaxial layer 5 is formed over the silicon nitride film 3a or the silicon oxide film 4a, there is the fear that a crack may be caused in the epitaxial layer 5 in a later polishing step. However, it is actually difficult to precisely control the position of the upper surface of the epitaxial layer 5 that is formed by an epitaxial growth process, and hence it is considered that the upper surface of the epitaxial layer 5 may be formed over the silicon nitride film 3a, for example, may be formed at a position higher than the silicon oxide film 4a, as illustrated in FIG. 6. For example, when the thickness of the silicon oxide film 4a is made large, it can be prevented that the upper surface of the epitaxial layer 5 may exceed the upper surface of the silicon oxide film 4a, and hence polishing can be performed so as not to cause a crack in the epitaxial layer 5. That is, it is preferable that the thickness of the silicon oxide film 4a is made larger than that of the silicon nitride film 3a or that of the silicon layer 3.

In each of FIGS. 7 to 16 to be used for description of the following manufacturing steps, the description will be made, assuming that: the region illustrated on the left side of the sectional view, in which the silicon layer 3 is formed, is the SOI region LA; and the region on the right side thereof, in which the epitaxial layer 5 is formed, is the bulk silicon region 1B.

Figure 7:
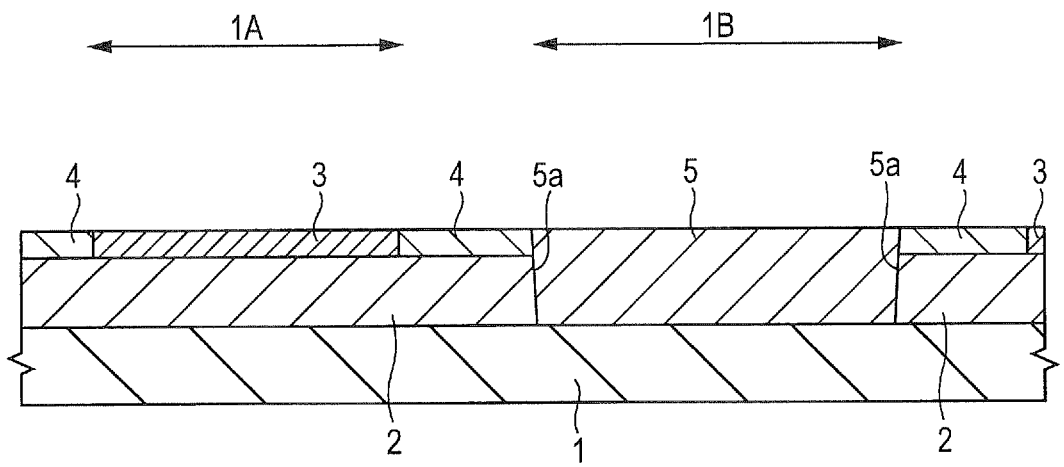
FIG. 7 is a sectional view illustrating the method of manufacturing the semiconductor device following FIG. 6.

Subsequently, as illustrated in FIG. 7, the upper surface of the semiconductor substrate 1 is flattened by polishing the epitaxial layer 5, the silicon oxide film 4a, and the silicon nitride film 3a with the use of a CMP process. In this case, the silicon nitride film 3a is used as a stopper film in the CMP step and is completely removed, and hence the upper surface of the silicon layer 3 is exposed over the semiconductor substrate 1 after the polishing, and the respective upper surfaces of the silicon layer 3, the silicon oxide film 4a, and the epitaxial layer 5 are made to be located at the same height. Herein, it is allowed that the height of the upper surface of the epitaxial layer 5 in the bulk silicon region 1B may vary by approximately 100 nm in the polishing. In the present embodiment, the silicon nitride film 3a is formed and the film can be used as a stopper film in the step for polishing the epitaxial layer 5, and hence the upper surface of the epitaxial layer 5 can be precisely polished. Further, it can be prevented that the thickness of the silicon layer 3 may be too small, occurring due to excessive polishing of the silicon layer 3.

In the aforementioned CMP step, the element isolation region 4 comprised of the silicon oxide film 4a is formed, by polishing the silicon oxide film 4a, over the BOX film 2 and between the silicon layer 3 and the epitaxial layer 5. Thus, it is not needed to form the element isolation region 4 by a LOCOS process or an STI process, etc. Accordingly, manufacturing steps can be simplified. Because the distance between the silicon layer 3 and the epitaxial layer 5 is determined by the distance between the open end of the silicon layer 3 and the end of the opening 5a, not by the thickness of the silicon oxide film 4a, a desired space can be provided depending on a layout. Herein, the distance between the silicon layer 3 and the epitaxial layer 5 is made to be 5 μm or more, in order that an element, which forms a digital circuit to be formed in a later step, and an element, which forms an analog circuit, are far from each other.

Figure 8:
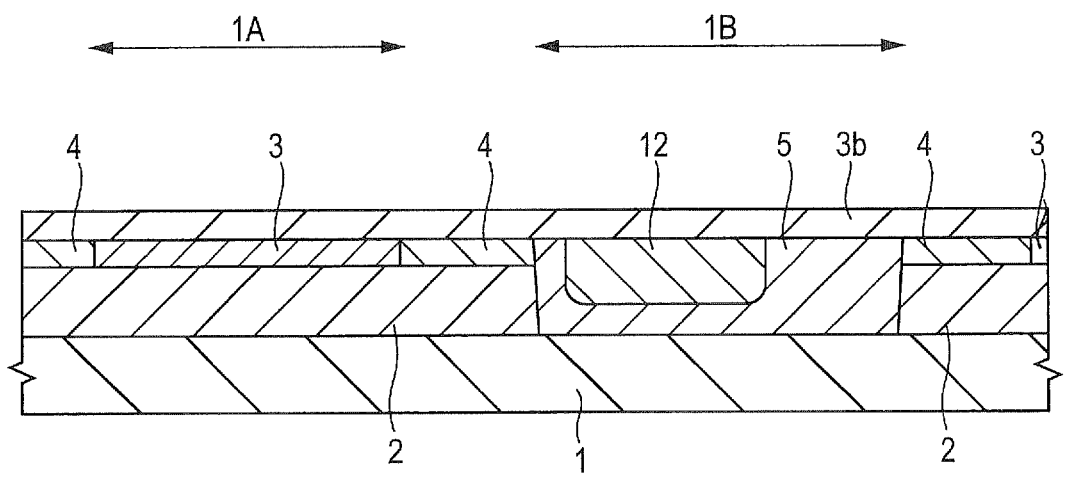
FIG. 8 is a sectional view illustrating the method of manufacturing the semiconductor device following FIG. 7.

Subsequently, as illustrated in FIG. 8, a silicon oxide film 3b is formed over the element isolation region 4, the silicon layer 3, and the epitaxial layer 5 by using, for example, a CVD process. A photoresist film (not illustrated) is then formed in part of the region immediately over the epitaxial layer 5, and a p-type impurity (e.g., B (boron)) is ion implanted, by using the silicon oxide film 3b as a through film, from the upside of the semiconductor substrate 1 toward the upper surface of each of the silicon layer 3 and the epitaxial layer 5. Thereby, the silicon layer 3 becomes a low-concentration p-type semiconductor layer, and the p-type well 12 is formed over the upper surface of the epitaxial layer 5. The p-type well 12 is formed over part of the upper surface of the epitaxial layer 5, not over the whole upper surface. In the SOI region 1A and the bulk silicon region 1B, the aforementioned ion implantation step may be performed separately from each other by using a photolithography technique, etc. Alternatively, the case where the p-type well 12 is not formed is also considered. The silicon oxide film 3b can also be formed by a thermal oxidation process, but in that case, there is the fear that the thickness of the silicon film in the silicon layer 3 may be decreased, which is not very preferable because the thickness of the silicon layer 3, indicated in the present embodiment, is as small as approximately 50 nm. Accordingly, it is preferable to form the silicon oxide film 3b by using a CVD process.

Figure 9:
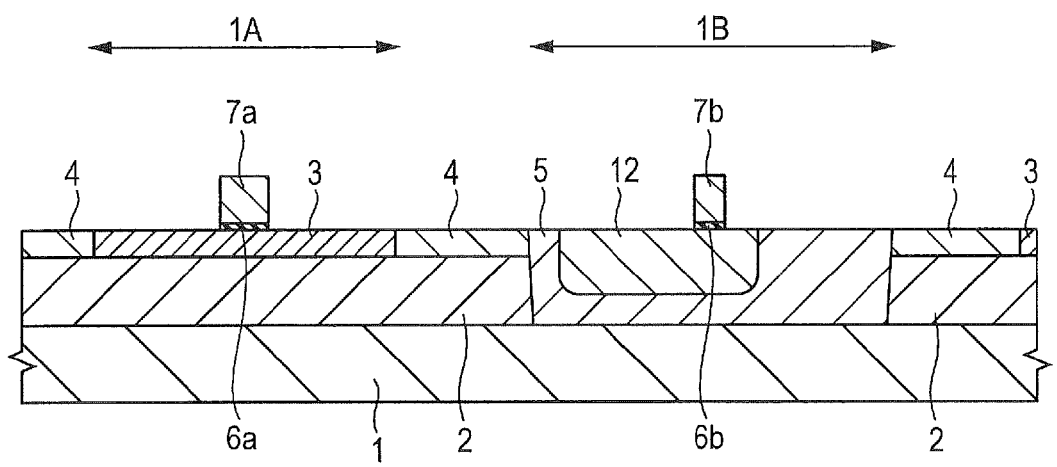
FIG. 9 is a sectional view illustrating the method of manufacturing the semiconductor device following FIG. 8.

Subsequently, as illustrated in FIG. 9, after the silicon oxide film 3b is removed by a wet etching process, an insulating film and a polysilicon film are sequentially formed over the whole surface of the semiconductor substrate 1, and the polysilicon film and the insulating film are patterned by using a photolithography technique and a dry etching process. Thereby, the gate insulating film 6a comprised of the insulating film is formed over the silicon layer 3 in the SOI region 1A, and the gate electrode 7a comprised of the polysilicon film is formed over the gate insulating film 6a. In addition, the gate insulating film 6b comprised of the insulating film is formed over the epitaxial layer 5 in the bulk silicon region 1B, and the gate electrode 7b comprised of the polysilicon film is formed over the gate insulating film 6b.

Herein, the gate length of the gate electrode 7a is made to be within a range of 0.15 to 5 μm and that of the gate electrode 7b is made to be within a range of 0.18 to 0.25 μm. As an example herein, each of the two gate electrodes is formed such that the gate length of the gate electrode 7a, which is formed in the SOI region 1A, is larger than that of the gate electrode 7b, which is formed in the bulk silicon region 1B. The polysilicon film, which forms the gate electrodes 7a and 7b, is made to be a low-resistance n-type semiconductor film (doped polysilicon film) by ion implanting an n-type impurity, such as P (phosphorus), As (arsenic), or the like. Alternatively, the polysilicon film, which is an amorphous silicon film when formed, can be changed to a polycrystalline silicon film by a heat treatment performed after being formed (after the ion implantation).

The thickness of the gate insulating film 6a is made to be within a range of 5 to 7 nm, and the thickness of the gate insulating film 6b is made to be within a range of 8 to 12 nm. An example of the case where two types of gate insulating films are formed, as stated above, is described below. A method is considered, in which: after a silicon oxide film is first deposited over the whole surface of the semiconductor substrate 1 by a CVD process, the silicon oxide film in the bulk silicon region 113 is removed; and subsequently a silicon oxide film is formed in the bulk silicon region 1B by using a thermal oxidation process, etc. Thereby, a silicon oxide film deposited in the SOI region 1A can be formed, and a thermally-oxidized silicon film, having a thickness larger than that of the aforementioned silicon oxide film, can also be formed in the bulk silicon region 1B. These two types of silicon oxide films form the insulating films. By processing these insulating films into gate insulating films, the gate insulating films, each having a thickness different from that of the other, can be formed in the SOI region 1A and the bulk silicon region 1B. In the accompanying drawings of the present application, the two types of the gate insulating films are illustrated to have the same thickness.

Although the gate insulating film 6a, which is a thin film, is formed by a CVD process, it can also be formed by a thermal oxidation process. However, the thickness of the silicon layer 3, indicated in the present embodiment, is as small as approximately 50 nm, and hence there is the fear that the thickness of the silicon film in the silicon layer 3 may be decreased. Accordingly, it is preferable to use a CVD process in forming the gate insulating film 6a. The gate insulating film 6b, which is a thick film, can also be formed by a CVD process.

Figure 10:
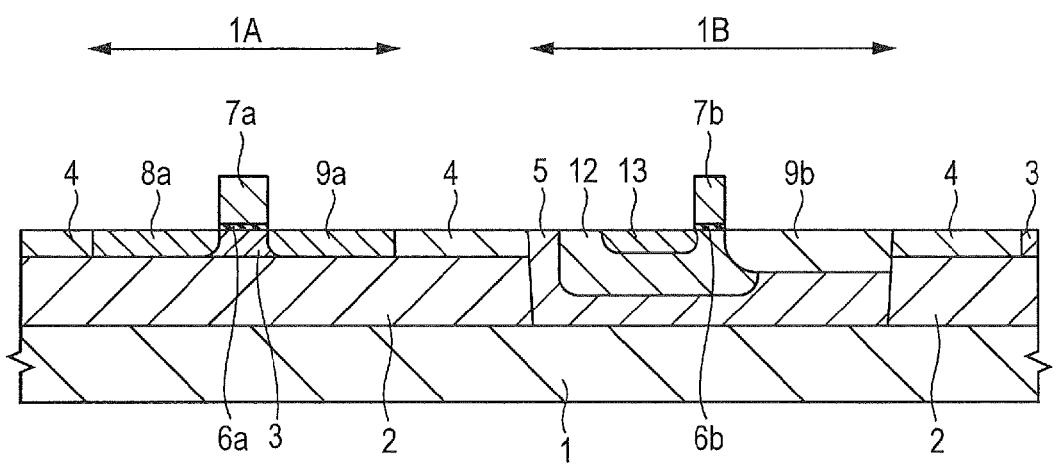
FIG. 10 is a sectional view illustrating the method of manufacturing the semiconductor device following FIG. 9.

Subsequently, as illustrated in FIG. 10, a pair of extension regions 8a and 9a, which are n-type semiconductor regions, are formed in the silicon layer 3, except part of the silicon layer 3 immediately below the gate electrode 7a, by ion implanting an n-type impurity, such as P (phosphorus), As (arsenic), or the like, into the upper surface of the silicon layer 3. That is, the extension regions 8a and 9a are formed in the silicon layer 3 in the regions on both sides of the gate electrode 7a, respectively. Similarly, the extension region 9b, which is an n-type semiconductor region, is formed over the upper surface of one of the epitaxial layers 5, which are located alongside the gate electrode 7b in the gate length direction thereof, by ion implanting an n-type impurity, such as P (phosphorus), As (arsenic), or the like, into the upper surface of the epitaxial layer 5. That is, in the bulk silicon region 1B, the extension region 9b is formed only in one of the epitaxial layers 5, which are located alongside the gate electrode 7b, unlike in the SOI region 1A.

When an extension region is formed in one of the SOI region 1A and the bulk silicon regions 1B, the other region is covered with a photoresist film, etc., and the extension regions in the respective regions are formed in steps different from each other. When the extension region 9b is formed, the upper surface of one of the epitaxial layers 5, by which the gate electrode 7b is sandwiched, is only covered with a photoresist film, and the extension region 9b is formed by performing ion implantation on the upper surface of the other epitaxial layer 5.

Thereafter, a relatively high-concentration of p-type impurities (e.g., B (boron)) are driven, by using a photolithography technique and an ion implantation process, into the epitaxial layer 5 in which the extension region 9b is not formed, of the epitaxial layers 5 by which the gate electrode 7b is sandwiched in the gate length direction thereof, thereby allowing the halo region 13 to be formed over the upper surface of the epitaxial layer 5 and near to the gate electrode 7b. Alternatively, the halo region 13 may be formed before the extension region 9b is formed.

Figure 11:
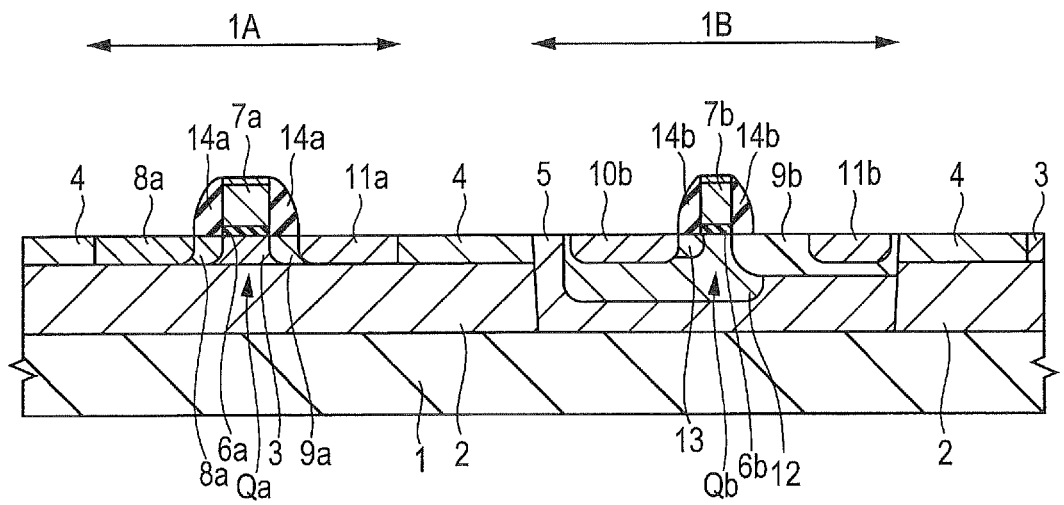
FIG. 11 is a sectional view illustrating the method of manufacturing the semiconductor device following FIG. 10.

Subsequently, as illustrated in FIG. 11, sidewalls (side wall insulating films) 14a and 14b, each of which is comprised of, for example, a silicon oxide film, a silicon nitride film, a laminated film of those insulating films, or the like, are formed, as insulating films and in a self-aligned manner, over the side walls of the gate electrodes 7a and 7b. The thickness in the gate length direction of the sidewall 14b formed on the side wall of the gate electrode 7b is made to be within a range of 50 to 200 nm, and the thickness in the gate length direction of the sidewall 14a formed on the side wall of the gate electrode 7a is made to be within a range of 50 to 300 nm.

Steps for forming two types of gate insulating films each having a width different from the other, as stated above, are as follows: for example, a first insulating film, which is comprised of a silicon oxide film, a silicon nitride film, or a laminated film of those films, is first deposited over the semiconductor substrate 1; the first insulating film is left over the side wall of each of the gate electrodes 7a and 7b by performing anisotropic etching with the use of an RIE (Reactive Ion Etching) process, etc.; subsequently, the first insulating film, which is left over the side wall of the gate electrode 7b, is removed while the gate electrode 7a is being covered with a photoresist film; after the photoresist film is removed, a second insulating film, which is comprised of silicon oxide, or the like, is deposited again over the semiconductor substrate 1, and thereafter the second insulating film is processed by anisotropic etching. Thereby, the sidewall 14b, which is comprised of the second insulating film, is only left over the side wall of the gate electrode 7b, and the sidewall 14a, which is comprised of the first insulating film and the second insulating film, is formed over the side wall of the gate electrode 7a. Accordingly, the sidewall 14a and the sidewall 14a having a width larger than that of the sidewall 14b can be formed. As stated above, the sidewalls are sometimes formed by laminated films, but in FIG. 11, each of the sidewalls 14a and 14b is illustrated as a film having one layer.

Subsequently, the diffusion layers 10a and 11a are formed over the upper surface of the silicon layer 3 and the diffusion layers 10b and 11b are formed over the upper surface of the epitaxial layer 5, by driving n-type impurities (e.g., As (arsenic)) into the silicon layer 3 and the epitaxial layer 5 with the use of a photolithography technique and an ion implantation process. In this case, the gate electrode 7a and the sidewall 14a formed over the side wall thereof are used as masks in the SOI region 1A, while the gate electrode 7b and a photoresist film (not illustrated) are used as masks in the bulk silicon region 1B.

Thereby, in the SOI region 1A, the n-channel type MOSFETQa is formed by: a source region formed by the diffusion layer 10a and the extension region 8a; a drain region formed by the diffusion layer 11a and the extension region 9a; and the gate electrode 7a. In the bulk silicon region 1B, the n-channel type MOSFETQb is formed by: a source region formed by the diffusion layer 10b; a drain region formed by the diffusion layer 11b and the extension region 9b; and the gate electrode 7b.

In the SOI region 1A, the diffusion layers 10a and 11a are formed in the silicon layer 3 located alongside the gate electrode 7a in the gate length direction thereof, in which the diffusion layer 10a is adjacent to the extension region 8a, the diffusion layer 11a is adjacent to the extension region 9a, and silicon layer 3, which is located immediately below the extension regions 8a and 9a and the gate electrode 7a, is arranged between the diffusion layers 10a and 11a.

On the other hand, in the bulk silicon region 1B, the diffusion layers 10b and 11b, each having a shape asymmetrical to the other with respect to the gate electrode 7b, are formed by using a photoresist film as a mask. Specifically, the diffusion layer 10b, which forms the source region of the MOSFETQb, is formed near to the gate electrode 7b, while the diffusion layer 11b, which forms the drain region of the MOSFETQb, is formed to be far from the gate electrode 7b. The extension region 9b is arranged between the diffusion layer lib and the upper surface of the epitaxial layer 5 immediately below the gate electrode 7b.

Accordingly, the distance between the diffusion layer 11b and the gate electrode 7b becomes larger than the distance occurring in the case where the diffusion layer 11b is formed in a self-aligned manner by an ion implantation process with the use only of the gate electrode 7b and the sidewall 14b as masks, not with the use of a photoresist film. In addition, by forming the extension region 9b between the diffusion layer 11b and the channel region, the impurities, which form the drain region, are diffused in the direction along the upper surface of the epitaxial layer 5, so that the content of the impurity becomes higher as being farther from the gate electrode 7b. Herein, by forming the MOSFETQb into an LDMOSFET having a drain region in which impurities are horizontally diffused, the electric field strength between the source and drain region can be reduced and the withstand voltage of the MOSFET can be enhanced.

When the diffusion layer 10b is formed immediately below the sidewall 14b in order to bring it close to the gate electrode 7b, for example, a method of using an angled ion implantation process where inclination is provided in the direction in which the ion implantation is performed, or a method in which the diffusion layers 10b and 11b are formed before the sidewall 14b is formed, etc., can be considered.

Herein, the MOSFETQb formed in the bulk silicon region 1B is made to be an asymmetrical LDMOSFET, but may be made to be a symmetrical MOSFET like the MOSFETQa formed in the SOI region 1A. Also, as illustrated in FIG. 11, a photoresist film is used, in the bulk silicon region 1B, as a mask in the ion implantation process, and an impurity is not driven into the end of the epitaxial layer 5 covered with the photoresist film, when the p-type well 12, the halo region 13, the extension region 9b, and the diffusion layers 10b and 11b are formed. After the extension region and the diffusion layers are formed by ion implantation process, an annealing treatment for activating the introduced impurity may be performed by a spike annealing treatment at, for example, approximately 1050° C.

Figure 12:
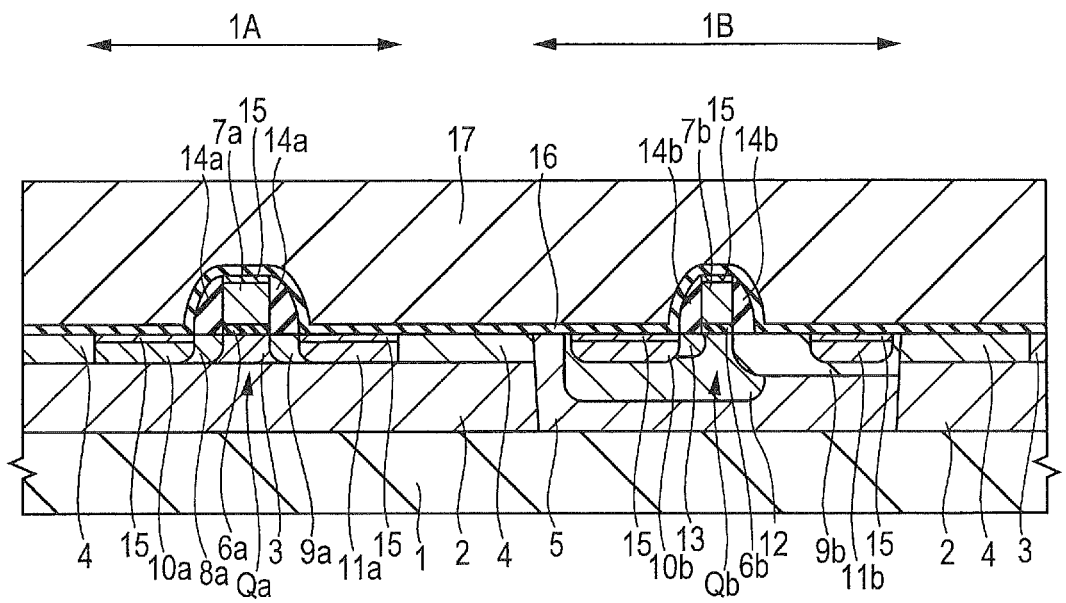
FIG. 12 is a sectional view illustrating the method of manufacturing the semiconductor device following FIG. 11.

Subsequently, as illustrated in FIG. 12, the low-resistance silicide layer 15 is formed, by a Salicide (Self Aligned Silicide) technique, over the surface of each of the gate electrode and the diffusion layer of each of the MOSFETQa and MOSFETQb.

In order to form the silicide layer 15, a metal film is first formed (deposited), by using, for example, a sputtering process, over the major surface (whole surface) of the semiconductor substrate 1 including the upper surface of each of the gate electrodes 7a and 7b and the diffusion layers 10a, 10b, 11a, and 11b. When the silicide layer 15 is selectively formed in part of the bulk silicon region 1B, as illustrated in FIG. 12, a Salicide process is used. That is, the silicide layer 15 is formed, over the upper surface of each of the gate electrodes 7a and 7b and the diffusion layers 10a, 10b, 11 and 11b, by forming a metal layer after the step described with reference to FIG. 11, and then by performing a heat treatment on the semiconductor substrate 1 to react the metal layer with Si included in the gate electrodes 7a and 7b, the silicon layer 3, and the epitaxial layer 5. As a material of the aforementioned metal film, for example, Co (cobalt) can be used.

Herein, the heat treatment for forming the silicide layer 15 is performed two times, in which: a first heat treatment (first annealing treatment) is performed at a temperature within a range of 250° C. to 300° C.; and a second heat treatment is then performed at a temperature within a range of approximately 500° C. to 600° C. An unreacted metal film is removed by wet cleaning using sulfuric acid, or that using an SPM (Sulfuric acid Hydrogen Peroxide Mixture: a mixed liquid of sulfuric acid and hydrogen peroxide solution), etc. Thereby, the silicide layer 15, which is comprised of $CoSi_2$ (cobalt silicide) that is a compound of Co (cobalt) included in the metal film and Si (silicon), is formed. Alternatively, the silicide layer 15 may be formed by titanium silicide, nickel silicide, platinum silicide, or the like, not limited to cobalt silicide.

Subsequently, the etching stopper film 16 is formed so as to cover the whole of the major surface of the semiconductor substrate 1. The etching stopper film 16 is comprised of, for example, a silicon nitride film, and can be formed by a plasma CVD process whose film formation temperature (substrate temperature) is approximately 450° C., etc. The etching stopper film 16 functions as an etching stopper film when contact holes are formed over the MOSFETQa and MOSFETQb.

Subsequently, the interlayer insulating film 17 having a thickness larger than that of the etching stopper film 16 is formed over the etching stopper film 16. The interlayer insulating film 17 is comprised of, for example, a silicon oxide film, etc., and can be formed by a plasma CVD process whose film formation temperature is approximately 450° C. in which TEOS (Tetra Ethyl Ortho Silicate), etc., is used. Thereafter, the upper surface of the interlayer insulating film 17 is flattened by polishing the surface thereof with the use of a CMP process, etc. Even when a concavo-convex shape is formed over the surface of the interlayer insulating film 17 due to a level difference in an under layer, the interlayer insulating film 17 whose surface is flattened can be obtained by polishing the surface thereof with the use of a CMP process.

Figure 13:
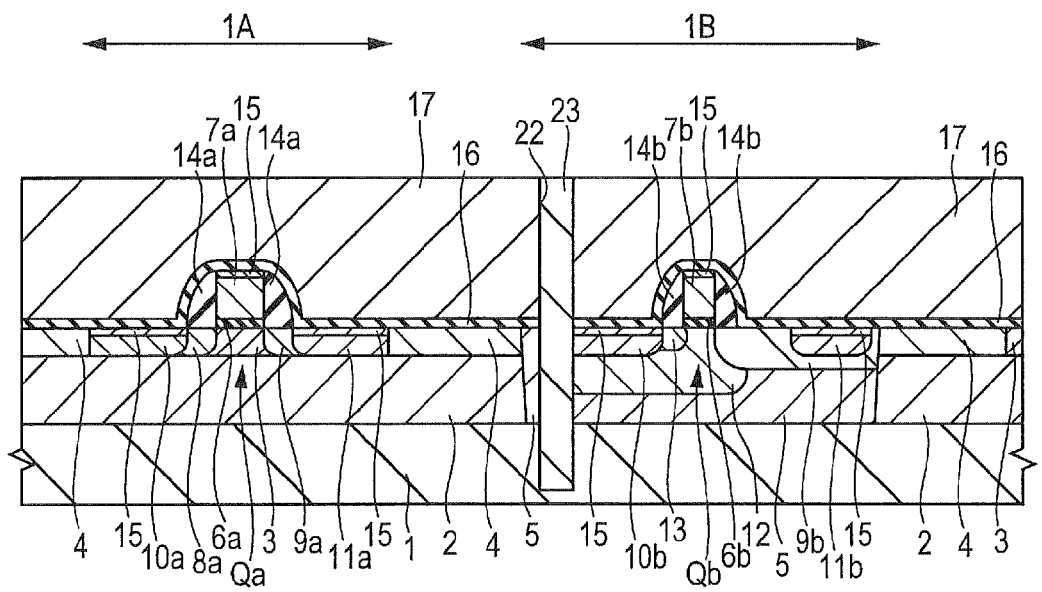
FIG. 13 is a sectional view illustrating the method of manufacturing the semiconductor device following FIG. 12.

Subsequently, as illustrated in FIG. 13, a groove-shaped (slit-shaped) via hole 22, which penetrates the interlayer insulating film 17, the etching stopper film 16, and the epitaxial layer 5 and reaches the middle of the depth of the semiconductor substrate 1, is formed by using an insulating film for a mask and a dry etching process. Herein, the via hole 22 is assumed to extend along the gate width direction (longitudinal direction) of the gate electrode 7b, when viewed planarly. The depth of the via hole 22 is 100 μm or less from the upper surface of the interlayer insulating film 17. The via hole 22 is formed to be in the bulk silicon region 1B and to be adjacent to the end of the MOSFETQb near to the source region.

Subsequently, a metal film 23 comprised of W (tungsten), etc., is formed in the via hole 22. In the step for forming the metal film 23, after a tungsten film is formed over the semiconductor substrate 1 by using a sputtering process, etc., the via hole 22 is completely filled with the tungsten film, and the tungsten film over the interlayer insulating film 17 is then removed by using a CMP process, etc. Thereby, the tungsten film is left only in the via hole 22, allowing the metal film 23 to be formed.

Figure 14:
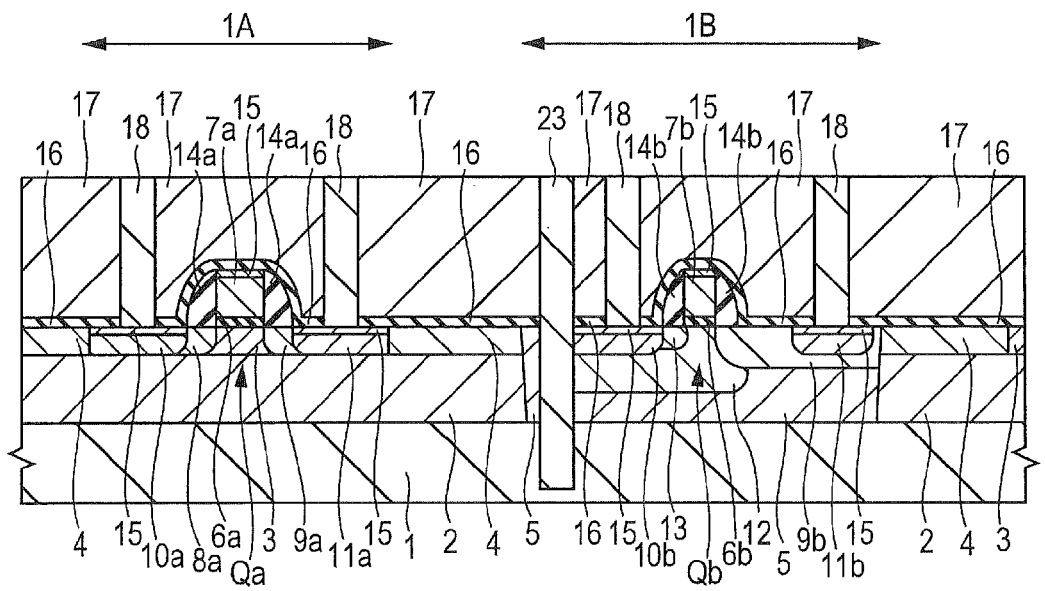
FIG. 14 is a sectional view illustrating the method of manufacturing the semiconductor device following FIG. 13.

Subsequently, as illustrated in FIG. 14, a plurality of contact holes, each of which penetrates the interlayer insulating film 17 and the etching stopper film 16 and reaches the silicide layer 15 over each of the silicon layer 3, the epitaxial layer 5, and the gate electrodes 7a and 7b, are formed by using a photolithography technique and a dry etching process.

Subsequently, the contact plugs 18, each of which is comprised of W (tungsten), etc., are formed in the contact holes by the same way as the metal film 23, in which: the contact hole is completely filled with a tungsten film, and the upper portion of the embedded tungsten film is then polished. Herein, the contact hole and the contact plug, which are formed over the gate electrodes 7a and 7b, are not illustrated.

Figure 15:
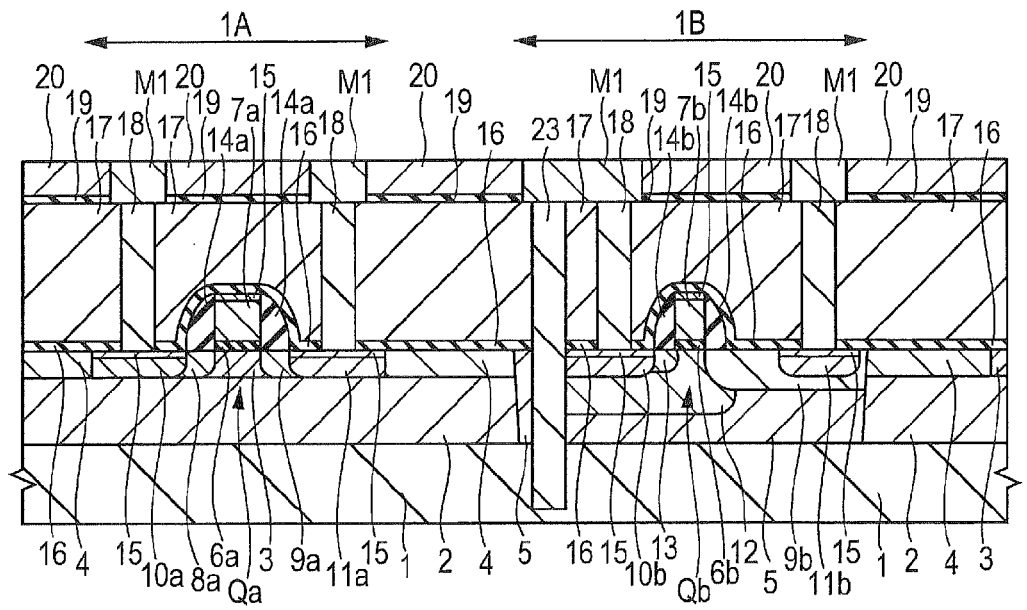
FIG. 15 is a sectional view illustrating the method of manufacturing the semiconductor device following FIG. 14.

Subsequently, as illustrated in FIG. 15, the etching stopper film 19 and the interlayer insulating film 20 are sequentially formed over the contact plug 18, the metal film 23, and the interlayer insulating film 17. The etching stopper film 19 is comprised of, for example, a silicon nitride film and is formed over the interlayer insulating film 17 by using a CVD process, etc. The interlayer insulating film 20 is comprised of, for example, an SiOC film and is formed over the interlayer insulating film 17 by using a CVD process, etc.

Subsequently, a plurality of wiring grooves, each of which penetrates the interlayer insulating film 20 and the etching stopper film 19 and exposes the upper surface of each of the interlayer insulating film 17, the contact plug 18, and the metal film 23, are formed by using a photolithography technique and a dry etching process. Thereafter, a metal film comprised of copper (Cu) is formed over the semiconductor substrate 1, thereby filling each of the wiring grooves with the metal film. Subsequently, a wiring M1 comprised of the metal film, with which each of the wiring grooves is completely filled, is formed by removing, with the use of a CMP process, etc., an unnecessary metal film comprised of copper (Cu) left over the interlayer insulating film 20. Thus, the wiring M1 to be coupled to the upper portion of each of the contact plug 18 and the later-described through via is formed by a single damascene process. The upper surface of the contact plug 18 immediately over the diffusion layer 10b, the source region of the MOSFETQb, is coupled to the lower surface of the wiring M1 with which the upper surface of the metal layer 23, which is adjacent to the diffusion layer 10b, is in contact. Accordingly, the diffusion layer 10b and the metal film 23 are electrically coupled to each other via the wiring M1.

Figure 16:
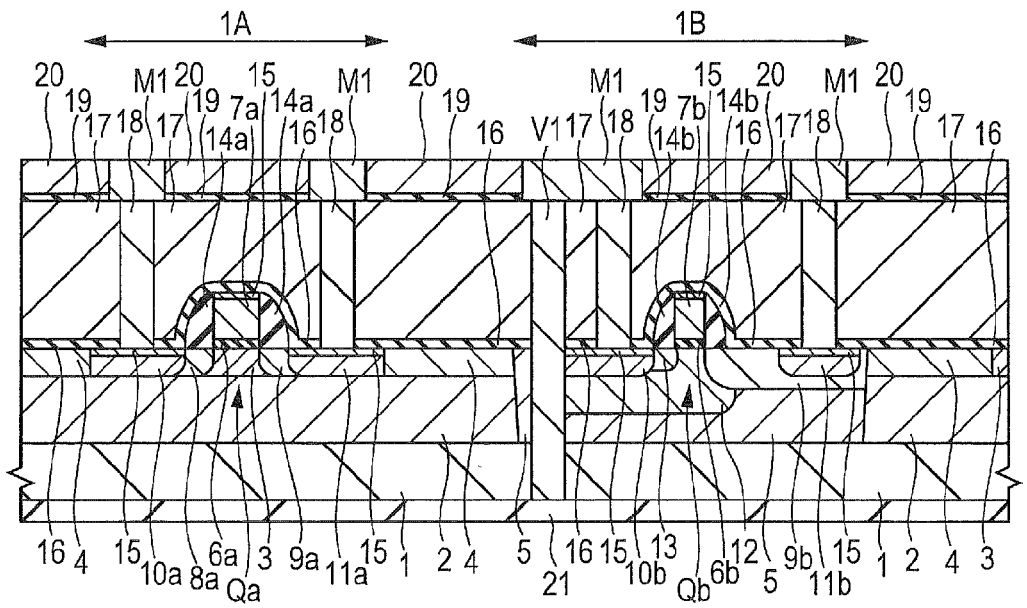
FIG. 16 is a sectional view illustrating the method of manufacturing the semiconductor device following FIG. 15.

Subsequently, as illustrated in FIG. 16, the thickness of the semiconductor substrate 1 is made small by retreating the back surface thereof with the use of an etch-back process or a CMP process, so that the lower surface of the metal film 23 is exposed, thereby allowing the through via V1 comprised of the metal film 23 to be formed. Thereafter, the back surface electrode 21, which is comprised of a laminated metal film formed by sequentially laminating, for example, Ni (nickel), Ti (titanium), and Au (Au), is formed over the back surface of the semiconductor substrate 1 by a sputtering process, etc. The back surface electrode 21 is electrically coupled to the diffusion layer 10b, the source region of the MOSFETQb, via the through via V1, the wiring M1, the contact plug 18, and the silicide layer 15. That is, the back surface electrode 21 serves as a source electrode that supplies a predetermined electric potential to the source region of the MOSFETQb while the MOSFETQb is working.

By the steps stated above, the semiconductor device according to the present embodiment, which has both the MOSFETQa that forms a digital circuit formed in the SOI region 1A and the MOSFETQb that forms a high-frequency analog circuit formed in the bulk silicon region 1B, is completed.

As methods of providing an SOI region and a bulk silicon region over one substrate, which are different from the method according to the present embodiment, the following two methods can be considered: a method in which an epitaxial layer is grown over a BOX film, which is part of the upper surface of an SOI substrate, and the epitaxial layer is used as a bulk silicon region; and a method in which a semiconductor substrate is exposed by removing both a BOX film, which is part of the upper surface of an SOI substrate, and a silicon layer located over the BOX film, and the exposed semiconductor substrate is used as a bulk silicon region. In these methods, however, a big level difference is caused between the upper surface of the SOI region and that of the bulk silicon region, and hence there is the problem that, in an exposure step, etc., in the manufacturing steps, a state of being out of focus is caused due to the aforementioned level difference, and accordingly a photoresist film cannot be precisely formed in each region. In order to solve this problem, if it is intended to perform, in the SOI region and the bulk silicon region, exposure of a photoresist film separately from the other in a state of being matched to the focal length in each of the two regions, the manufacturing steps become complicated and the manufacturing cost of a semiconductor device is increased.

In the steps for manufacturing a semiconductor device according to the present embodiment, the height of the upper surface of each of the silicon layer 3 and the epitaxial layer 5, which are provided over the semiconductor substrate 1, is made to be equal to the other by polishing, and hence a level difference is hardly caused between the SOI region 1A and the bulk silicon region 1B. Accordingly, a state of being out of focus is not caused even when the respective regions are collectively exposed, thereby allowing the reliability of the semiconductor device to be improved. Further, it is not needed to perform, in the SOI region and the bulk silicon region, an exposure step separately from the other, and hence the manufacturing cost of a semiconductor device can be reduced.

Further, in the steps for manufacturing a semiconductor device according to the present embodiment, it is made possible to provide an SOI region and a bulk silicon region over one semiconductor substrate having an SOI structure and to form MOSFETs suitable for the respective regions, by opening the major surface of the substrate and by forming an epitaxial layer in the opening. That is, both an element in which high density of the elements, reduction in power consumption, or high-speed, etc., can be expected by being formed in an SOI layer, and an element with a high-withstand voltage, which is difficult to be operated when provided in the SOI region, can be provided over one semiconductor chip. Thereby, a semiconductor device can be miniaturized.

In this case, by using the silicon nitride film 3a, which has been used as a mask in the step for patterning the silicon layer 3, the step being described with reference to FIG. 3, as a stopper film in the step for polishing the upper surface of the epitaxial layer 5, the step being described with reference to FIG. 7, the polishing can be precisely performed. Thereby, it can be prevented that the performance of an element formed in the SOT region 1A may vary and the reliability of a semiconductor device may be decreased, which are caused by excessive polishing of the silicon layer 3 in which the source and drain region, the channel region, or the like, of the MOSFET are to be formed.

Because a region that forms the silicon layer 3, which forms the SOI layer, and a region that forms the epitaxial layer 5 are manufactured separately from each other by patterning, the distance between the SDI region 1A and the bulk silicon region 1B can be largely secured. Specifically, the distance between the silicon layer 3 and the epitaxial layer 5 can be made to be 5 μm or more. Thereby, it can be prevented that a digital circuit in the SOI region 1A may not work properly due to an influence from a high-frequency analog circuit in the bulk silicon region 1B.

(Second Embodiment)

In the present embodiment, both a method of manufacturing a semiconductor device that is different from the semiconductor device according to First Embodiment in that: a via reaching the upper surface of a semiconductor substrate from a wiring over an element is provided around an SOI region; a back surface electrode is not formed; and a via penetrating the bulk silicon region 1B is not formed, and the semiconductor device will be described.

Figure 17:
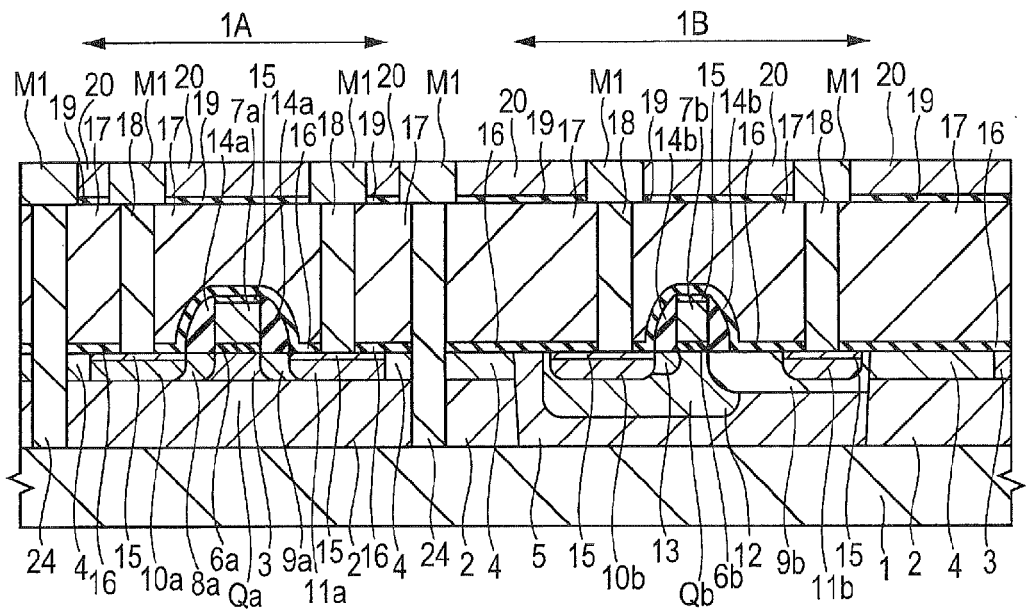
FIG. 17 is a sectional view of a semiconductor device according to Second Embodiment of the present invention.

FIG. 17 is a sectional view of a semiconductor device according to the present embodiment. The structure whose section is illustrated in FIG. 17 is almost similar to that of the semiconductor device described with reference to FIG. 1 in First Embodiment; however, is different therefrom in that: a contact plug 24 reaching the upper surface of the semiconductor substrate 1 and the wiring M1 located over it are formed outside the SOI region LA; and a back surface electrode and a through via in the bulk silicon region 1B are not formed.

As illustrated in FIG. 17, the contact plug 24 reaching the upper surface of the semiconductor substrate 1 from the upper surface of the interlayer insulating film 17 is formed, via the element isolation region 4, near to the SOI region 1A and outside the silicon layer 3. The contact plug 24 is comprised mainly of, for example, tungsten (W) and the wiring M1 is coupled to the upper surface of the contact plug 24, the wiring M1 penetrating a laminated film comprised of the etching stopper film 19 and the interlayer insulating film 20 and being embedded in a wiring groove. The contact plug 24 has, when viewed planarly, a pattern of extending in one direction, and is formed, for example, along the direction in which the gate electrode 7a extends.

The contact plug 24 is a through via penetrating a BOX film, which is formed in order to control the electric potential of the semiconductor substrate 1 and to separate an element in the SOI region 1A from that outside the SOI region 1A, etc. That is, by controlling the electric potential of the semiconductor substrate 1, it can be prevented that a parasitic capacitance may be caused between the MOSFETQa in the SOI region 1A and the semiconductor substrate 1. Further, by making the contact plug 24 function as a guard ring, it can be prevented that a high-frequency signal may flow through an element in the SOI region 1A and accordingly a noise may be caused.

When the electric potential of the semiconductor substrate 1 is controlled, a diffusion region (not illustrated) having a lower-resistance than that of the semiconductor substrate 1 may be formed by implanting a p-type impurity (e.g., B (boron)) into the upper surface of the semiconductor substrate 1 including an area immediately below the contact plug 24.

In addition, as illustrated in FIG. 17, the back surface electrode 21 (see FIG. 1) is not formed over the back surface of the semiconductor substrate 1, and the through via V1 (see FIG. 1) is also not formed in the bulk silicon region 1B. Although a source electrode may be formed over the back surface of the semiconductor substrate 1, as in First Embodiment, an electric potential may be supplied to the diffusion layer 10b, which is a source region, through the contact plug 18 over the diffusion layer 10b, the wiring M1, a laminated wiring (not illustrated) over the wiring M1, and an electrode pad (not illustrated), as in the present embodiment.

Figure 18:
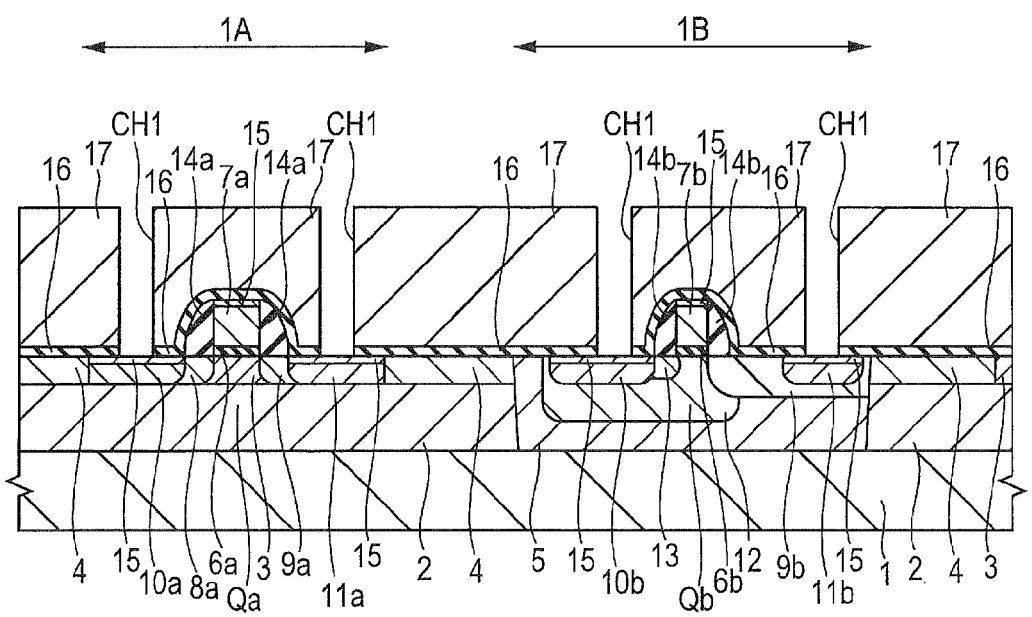
FIG. 18 is a sectional view illustrating a method of manufacturing the semiconductor device according to Second Embodiment of the invention.
Figure 19:
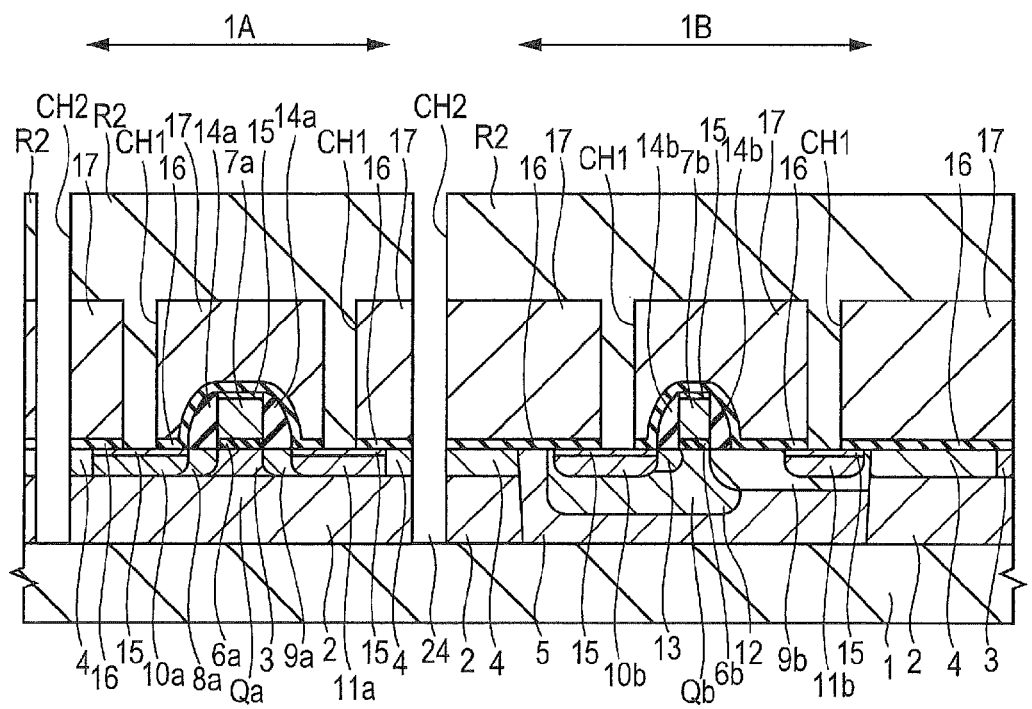
FIG. 19 is a sectional view illustrating the method of manufacturing the semiconductor device following FIG. 18.
Figure 20:
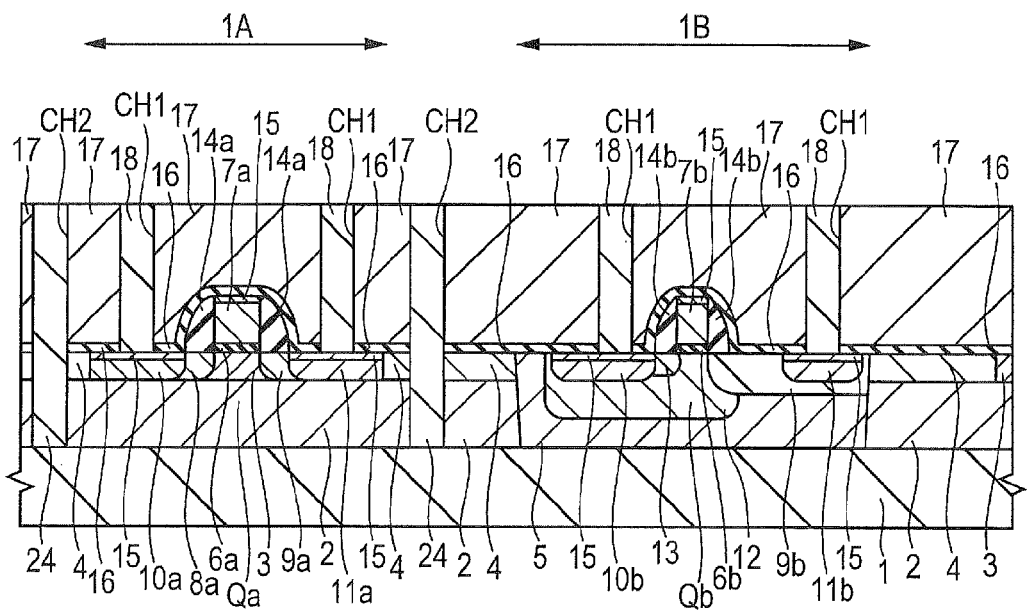
FIG. 20 is a sectional view illustrating the method of manufacturing the semiconductor device following FIG. 19.

Subsequently, the steps for manufacturing the semiconductor device according to the present embodiment will be described with reference to FIGS. 18 to 20. FIGS. 18 to 20 are sectional views for explaining the steps for manufacturing a semiconductor device according to the embodiment.

As illustrated in FIG. 18, the step described with reference to FIGS. 2 to 12 are first performed, and a contact hole CH1, which penetrates the etching stopper film 16 and the interlayer insulating film 17 and exposes the upper surface of the silicide layer 15, is then formed in an area immediately over each of the diffusion layers 10a, 10b, 11a, and 11b, by using a photolithography technique and a dry etching process. In non-illustrated regions, a contact hole is also formed in an area immediately over each of the gate electrodes 7a and 7b in this step.

Subsequently, as illustrated in FIG. 19, after a photoresist film R2, which has been formed by a photolithography technique, is formed, a plurality of contact holes CH2, each of which penetrates the etching stopper film 16, the interlayer insulating film 17, and the element isolation region 4 and exposes the upper surface of the semiconductor substrate 1, are formed by using a dry etching process with the use of the photoresist film R2 as a mask. The contact hole CH2 is a groove extending in one direction, when viewed planarly, and is formed, for example, along the direction in which the gate electrode extends.

Subsequently, as illustrated in FIG. 20, after the photoresist film R2 is removed, a tungsten film is formed by using, for example, a sputtering process so that the contact holes CH1 and CH2 are completely filled therewith. Thereafter, by removing the unnecessary tungsten film over the interlayer insulating film 17 with the use of a CMP process, etc., the contact plug 18 is formed in each of the contact holes CH1, and the contact plug is formed in each of the contact holes CH2.

By performing subsequent steps in the same way as those described with reference to FIG. 15, the etching stopper film 19 and the interlayer insulating film 20 are sequentially formed over the interlayer insulating film 17. Thereafter, a plurality of wiring grooves, each of which penetrates the etching stopper film 19 and the interlayer insulating film 20, are formed, and the wiring M1, a copper wiring, is then formed in each of the wiring grooves, thereby allowing the semiconductor device illustrated in FIG. 17 to be completed. However, unlike the step described with reference to FIG. 15, the wiring M1 in contact with the upper surface of the contact plug 24 is also formed herein. Unlike in First Embodiment, the wiring M1 coupled to the source region of the MOSFETQb is not coupled to the through via.

When it is intended to form the aforementioned diffusion region over the upper surface of the semiconductor substrate 1, a method is considered, in which: an impurity ion is driven into the upper surface of the semiconductor substrate 1 from the upside of the semiconductor substrate 1 and the BOX film by using a photolithography technique and an ion implantation process, while the step described with reference to FIG. 2 or FIG. 7 is being performed and before a semiconductor element is formed in the SOI region 1A or the bulk silicon region 1B.

(Third Embodiment)

In the present embodiment, both a method of manufacturing a semiconductor device in which it can be prevented that a defect may be caused in the epitaxial layer in a bulk silicon region, and the semiconductor device will be described.

Figure 21:
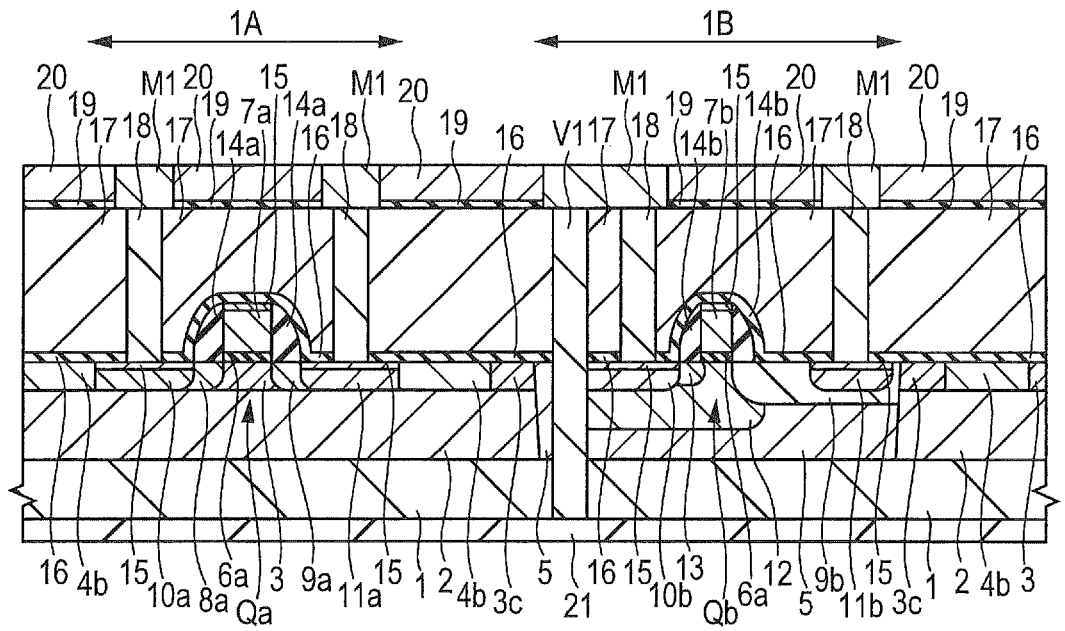
FIG. 21 is a sectional view of a semiconductor device according to Third Embodiment of the present invention.

FIG. 21 is a sectional view of a semiconductor device according to the present embodiment. The structure whose section is illustrated in FIG. 21 is almost similar to that of the semiconductor device described with reference to FIG. 1 in First Embodiment; however, is different therefrom in that a silicon layer 3c is formed to be in contact with the side wall of the epitaxial layer 5. The silicon layer 3c is formed over the BOX film 2, but unlike the silicon layer 3 in the SOI region 1A, the layer 3c is not formed in order to form a semiconductor element over itself.

Because an epitaxial layer to be formed by an epitaxial growth process grows with a layer comprised of silicon (Si) being a nucleus, there is the problem that: high-crystallinity is exhibited in a region in contact with the silicon layer, and conversely a defect, in which crystallinity is deteriorated, is caused in a region in contact with a film other than silicon, for example, in contact with a silicon oxide film.

When an epitaxial layer is formed in an opening of the BOX film or an opening of an insulating film comprised of silicon oxide, such as the element isolation region, an epitaxial layer having high-crystallinity is formed in a region far from the side wall of the epitaxial layer where the epitaxial layer and the insulating layer are in contact with each other.

However, a silicon layer, which serves as a growth nucleus for the epitaxial layer, is not present near to the side wall of the epitaxial layer where the epitaxial layer and the insulating film are in contact with each other, and hence a defect is caused in the epitaxial layer, the defect being exposed at the end of the upper surface of the epitaxial layer. In this case, if a semiconductor element is formed at the end of the upper surface of the epitaxial layer, a desired performance cannot be obtained, thereby decreasing the reliability of a semiconductor device. When a semiconductor element is not formed at the end of the upper surface of an epitaxial layer to avoid the aforementioned defect, there is the problem that the area of a semiconductor device becomes large.

On the other hand, in the semiconductor device according to the present embodiment, the silicon layer 3c is formed to be in contact with the upper portion of the side wall of the epitaxial layer 5, as illustrated in FIG. 21, and hence the silicon (si) that forms the silicon layer 3c serves as an epitaxial growth nucleus, when the epitaxial layer 5 is formed. Accordingly, even if a defect is caused in the epitaxial layer 5 near to the interface between the side wall of the epitaxial layer 5 and the BOX film 2, the end of the upper surface of the epitaxial layer 5 becomes a silicon layer having high-crystallinity. Accordingly, if a MOSFET, etc., is formed at the end of the epitaxial layer 5, it can be prevented that a poor property, occurring due to a defect in the epitaxial layer 5, is caused in the MOSFET, thereby allowing the reliability of the semiconductor device to be improved.

Subsequently, steps for manufacturing the semiconductor device according to the present embodiment will be described with reference to FIGS. 22 to 25. FIGS. 22 to 25 are sectional views for explaining the steps for manufacturing the semiconductor device according to the embodiment.

Figure 22:
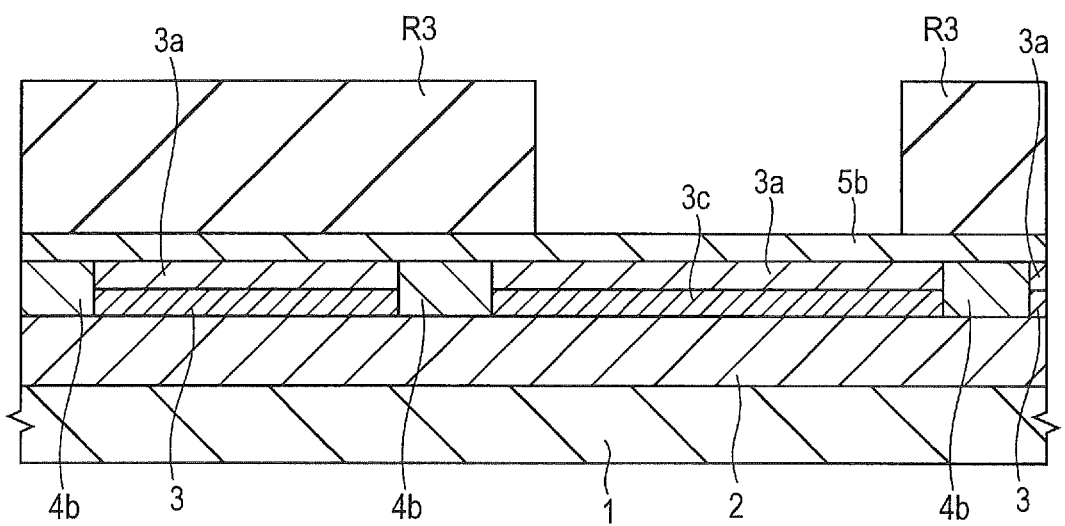
FIG. 22 is a sectional view illustrating a method of manufacturing the semiconductor device according to Third Embodiment of the invention.

The SOI substrate described with reference to FIG. 2 is first provided, and as illustrated in FIG. 22, the silicon nitride film 3a is then formed over the silicon layer 3, and thereafter the upper surface of the BOX film 2 is exposed by partially removing the silicon nitride film 3a and the silicon layer 3 to form a groove with the use of a photolithography technique and a dry etching process. Thereby, the silicon layer 3 and the silicon layer 3c comprised of the silicon layer 3 are separated from each other. Herein, the silicon layer 3 illustrated in FIG. 2 is divided by the aforementioned etching step. Of the divided silicon layers, one located in a region that will become a bulk silicon region in a later step is referred to as the silicon layer 3c.

Subsequently, a silicon oxide film is formed over the whole surface of the semiconductor substrate 1 by using, for example, a CVD process such that the groove is filled. Thereafter, by removing the silicon oxide film over the silicon nitride film 3a with the use of, for example, a CMP process, an element isolation region 4b comprised of the silicon oxide film is formed in a groove formed between a laminated film comprised of the silicon layer 3 and the silicon nitride film 3a and a laminated film comprised of the silicon layer 3c and the silicon nitride film 3a. That is, the element isolation region 4b is formed by an STI process.

Herein, both the silicon layer 3c comprised of the silicon layer 3 and the silicon nitride film 3a located over the layer 3c are left in a region between the silicon layers 3 adjacent to each other, the region being illustrated in FIG. 3 used in the description of First Embodiment and the silicon layer 3 being removed from the region. The distance between the silicon layer 3 and the silicon layer 3c, i.e., the width of the element isolation region 4b is 5 μm or more.

Thereafter, a silicon oxide film 5b is formed, by using, for example, a CVD process, so as to cover the upper surface of each of the silicon nitride film 3a and the element isolation region 4b. Subsequently, after a photoresist film is coated on the silicon oxide film 5b, a photoresist film R3 having a desired pattern is formed by exposing and developing the photoresist film. The photoresist film R3 functions to expose the upper surface of the silicon oxide film 5b in a region where an epitaxial layer is formed in a later step.

Figure 23:
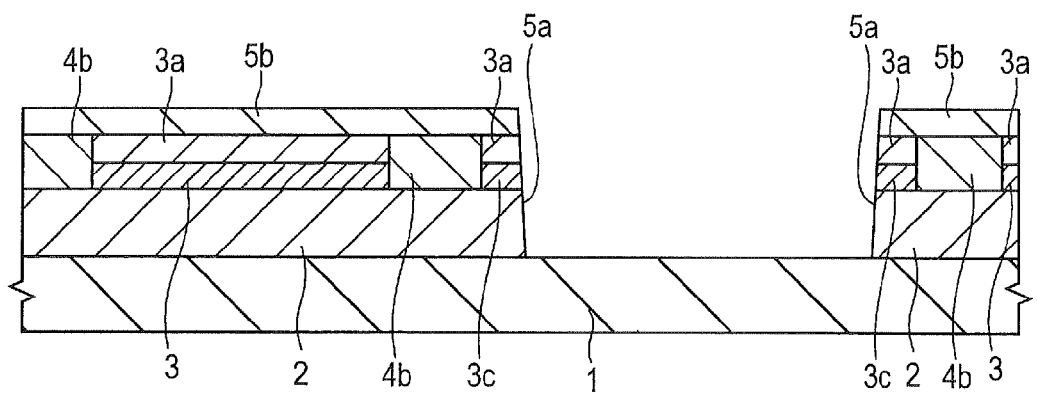
FIG. 23 is a sectional view illustrating the method of manufacturing the semiconductor device following FIG. 22.

Subsequently, as illustrated in FIG. 23, an opening 5a is formed by removing, with the use of a dry etching process using the photoresist film R3 as a mask, the silicon oxide film 5b, the silicon nitride film 3a, the silicon layer 3c, and the BOX film 2 to expose the upper surface of the semiconductor substrate 1. The photoresist film R3 is then removed. The side wall of the silicon layer 3c is exposed to the internal wall of the opening 5a.

Figure 24:
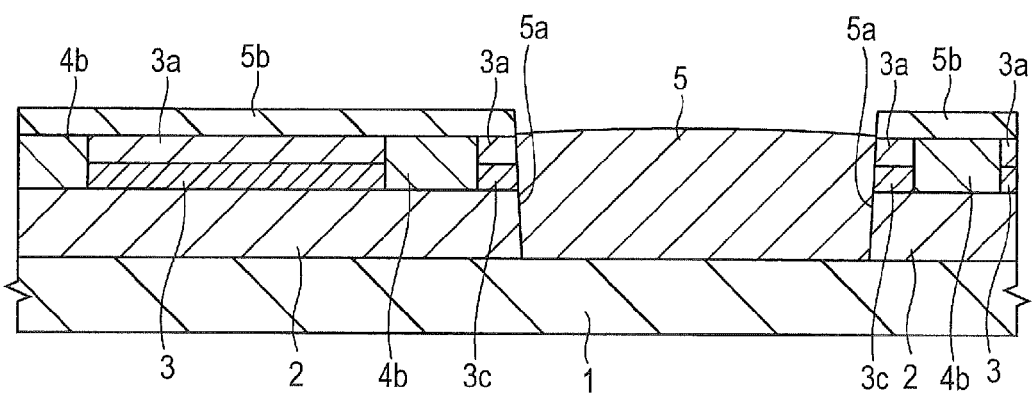
FIG. 24 is a sectional view illustrating the method of manufacturing the semiconductor device following FIG. 23.

Subsequently, as illustrated in FIG. 24, the epitaxial layer 5 is formed in the opening 5a by being selectively grown from the upper surface of the semiconductor substrate 1 with an epitaxial growth process. The epitaxial layer 5 is formed to fill the opening 5a and to reach a position that is higher than those of the silicon layers 3 and 3c and lower than that of the upper surface of the silicon oxide film 5b. It is preferable that the upper surface of the epitaxial layer 5 is not formed at a position lower than those of the silicon layers 3 and 3c, as stated above. That is, the epitaxial layer 5 is formed to be embedded to a height the same as that of the upper surface of each of the silicon layers 3 and 3c.

The epitaxial layer 5 is made to be a low-concentration p-type semiconductor region by introducing a p-type impurity (e.g., B (boron)) along with a material gas while the epitaxial layer 5 is being formed, or by ion implanting a p-type impurity (e.g., B (boron)) after the epitaxial layer 5 has been formed, not while the epitaxial layer 5 is being formed.

Figure 25:
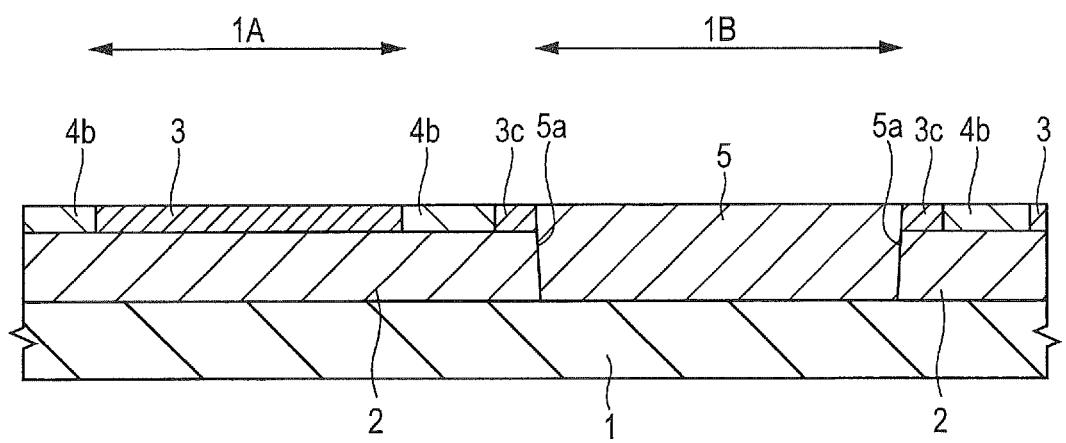
FIG. 25 is a sectional view illustrating the method of manufacturing the semiconductor device following FIG. 24.

Subsequently, as illustrated in FIG. 25, the upper surface of the epitaxial layer 5 is flattened by using, for example, a CMP process, and the upper surface of the silicon layer 3 is exposed. That is, by removing the silicon oxide film 5b with the use of the silicon nitride film 3a as a stopper film in a polishing step and then by removing both the upper portion of the element isolation region 4b and the silicon nitride film 3a, the upper surface of the substrate is flattened such that the height of the upper surface of the epitaxial layer 5 and that of the upper surface of the silicon layer 3 are made to be equal to each other.

In this case, if the upper surface of the epitaxial layer 5 is formed at a position higher than that of the silicon oxide film 5b before the CMP step, there is the fear that a crack may be caused in the epitaxial layer 5 in a polishing step by a CMP process. It is difficult to form the epitaxial layer 5 while the position of the upper surface thereof is being controlled. When it is intended to form the whole upper surface of the epitaxial layer 5 to a position higher than that of the silicon layer 3, there is the high possibility that the upper surface of the epitaxial layer 5 may be higher than the silicon nitride film 3a. This is because: it is difficult to precisely control the growth of the epitaxial layer and to stop the upper surface thereof at a target position; and also the thickness of the silicon nitride film 3a is as small as approximately 50 nm.

On the other hand, in the present embodiment, it can be prevented by forming the silicon oxide film 5b that the epitaxial layer 5 may be formed to be higher than any other layer over the semiconductor substrate 1. That is, a margin for the epitaxial growth can be secured, and hence, even if the upper surface of the epitaxial layer 5 is higher than the upper surface of the silicon nitride film 3a, polishing can be performed so as not to cause a crack in the epitaxial layer 5, when the uppermost surface of the epitaxial layer 5 is lower than that of the upper surface of the silicon oxide film 5b, thereby allowing the reliability of the semiconductor device to be improved.

In addition, as described with reference to FIG. 21, it can be considered that an epitaxial layer, which is formed near to a BOX film comprised of a silicon oxide film, may have a defect, and it is also considered that, because an epitaxial layer has higher-crystallinity when a larger amount of heat is applied, high-temperature is applied to an epitaxial layer while being formed. However, an epitaxial layer is likely to grow greatly under high-temperature, and hence an amount of the epitaxial layer that rises on the silicon layer 3 is increased, thereby causing the problem that it becomes difficult to polish the upper surface of the epitaxial layer 5. In that case, an amount of the epitaxial layer 5 to be polished is also increased, and hence the polishing step needs a long period of time, thereby increasing the manufacturing cost of a semiconductor device.

On the other hand, in the present embodiment, by exposing the silicon layer 3c to the internal wall of the opening 5a to increase the crystallinity of the upper portion of the side wall of the epitaxial layer 5, it is prevented that a defect may be caused at the end of the upper surface of the epitaxial layer 5 illustrated in FIG. 25. Accordingly, it is not needed to apply high-temperature while the epitaxial layer 5 is being formed, and hence the growth of the epitaxial layer 5 can be suppressed. Thereby, an amount of the epitaxial layer 5 to be polished in a polishing step by a CMP process, etc., can be reduced, and it can also be prevented that the upper surface of the epitaxial layer 5 may rise to a position higher than that of any other layer, thereby allowing the polishing step to be made easy.

By performing the following steps similar to those described with reference to FIGS. 8 to 16, the semiconductor device illustrated in FIG. 21 is completed.

(Fourth Embodiment)

In the present embodiment, both a method of manufacturing a semiconductor device in which: an epitaxial layer can be formed in a desired region, irrespective of the layout of an SOI region or an element isolation region; and it can be prevented that a defect may be caused over the surface of an SOI layer in a polishing step, and the semiconductor device will be described.

Steps for manufacturing the semiconductor device according to the present embodiment will be described with reference to FIGS. 26 to 31. FIGS. 26 to 31 are sectional views for explaining the steps for manufacturing the semiconductor device according to the embodiment.

Figure 26:
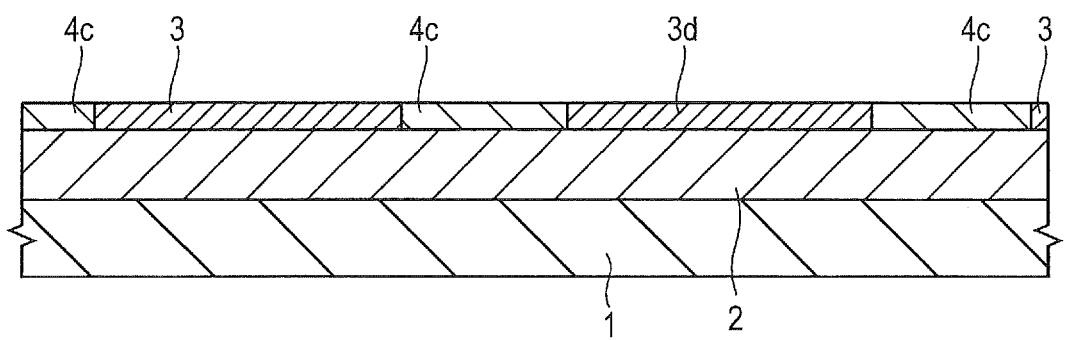
FIG. 26 is a sectional view illustrating a method of manufacturing a semiconductor device according to Fourth Embodiment of the invention.

The SOI substrate described with reference to FIG. 2 is first provided, and as illustrated in FIG. 26, the upper surface of the BOX film 2 is then exposed by patterning the silicon layer 3 with the use of a photolithography technique and a dry etching process. Thereby, the silicon layer 3 and a silicon layer 3d comprised of the silicon layer 3 are separated from each other. Herein, the silicon layer 3 illustrated in FIG. 2 is divided by being patterned with aforementioned etching process. Of the divided silicon layers, one located in a region that will become a bulk silicon region in a later step is referred to as the silicon layer 3d.

Subsequently, a silicon oxide film is formed over the whole surface of the semiconductor substrate 1 by using, for example, a CVD process such that the groove is filled. Thereafter, by removing the silicon oxide film over each of the silicon layer 3 and the silicon layer 3d with the use of, for example, a CMP process, an element isolation region 4c comprised of the silicon oxide film is formed in a groove formed between the silicon layer 3 and the silicon layer 3d. That is, the element isolation region 4c is formed by an STI process.

Herein, the silicon layer 3d comprised of the silicon layer 3 is left, as illustrated in FIG. 26, in a region between the silicon layers 3 adjacent to each other, the region being illustrated in FIG. 3 used in the description of First Embodiment and the silicon layer 3 being removed from the region. The distance between the silicon layer 3 and the silicon layer 3d, i.e., the width of the element isolation region 4s is 5 μm or more.

Figure 27:
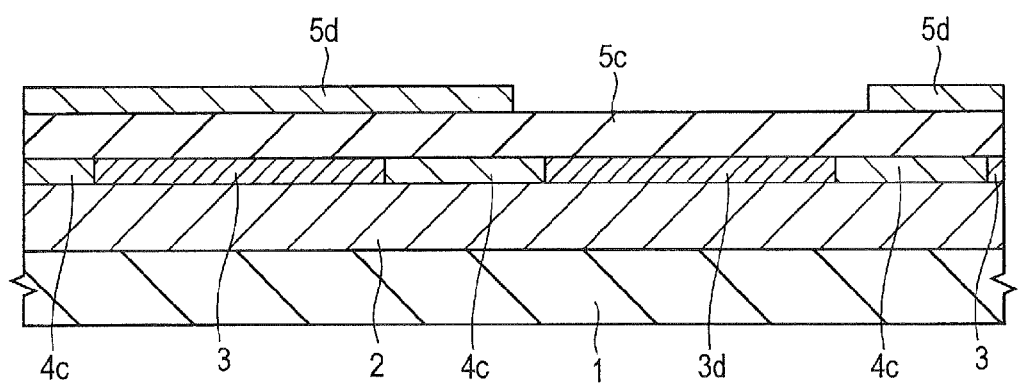
FIG. 27 is a sectional view illustrating the method of manufacturing the semiconductor device following FIG. 26.

Subsequently, as illustrated in FIG. 27, a silicon oxide film 5c and a silicon nitride film 5d are sequentially formed, by using, for example, a CVD process, so as to cover the upper surface of each of the silicon layers 3 and 3d and the element isolation region 4c. The silicon nitride film 5d is opened by removing the film 5d immediately over the silicon layer 3d with the use of a photolithography technique and a dry etching process. The thickness of the silicon nitride film 5d is made to be 100 nm or less.

Figure 28:
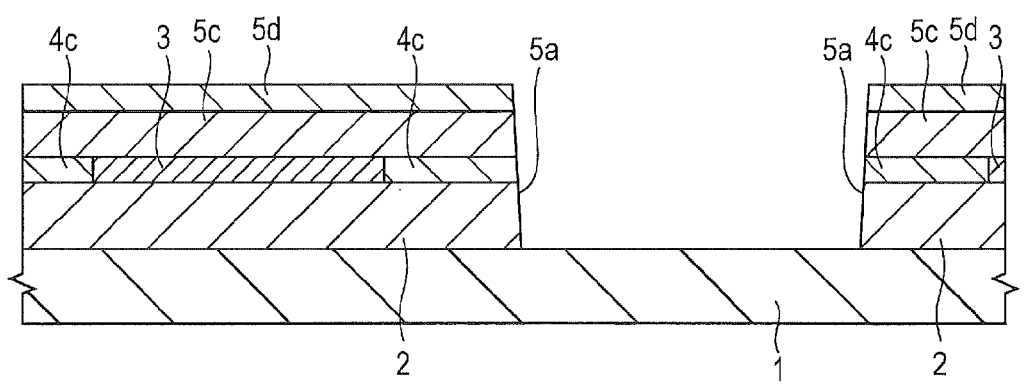
FIG. 28 is a sectional view illustrating the method of manufacturing the semiconductor device following FIG. 27.

Subsequently, as illustrated in FIG. 28, an opening 5a is formed by removing, with the use of a dry etching process using the silicon nitride film 5d as a mask, the silicon oxide film 5c, the silicon layer 3d, and the BOX film 2 to expose the upper surface of the semiconductor substrate 1. In this case, in forming the opening 5a, the element isolation region 4c, which is adjacent to the silicon layer 3d, may be partially removed, or the silicon layer 3d may be partially left and the side wall of the silicon layer 3d may be exposed to the internal wall of the opening 5a.

Figure 29:
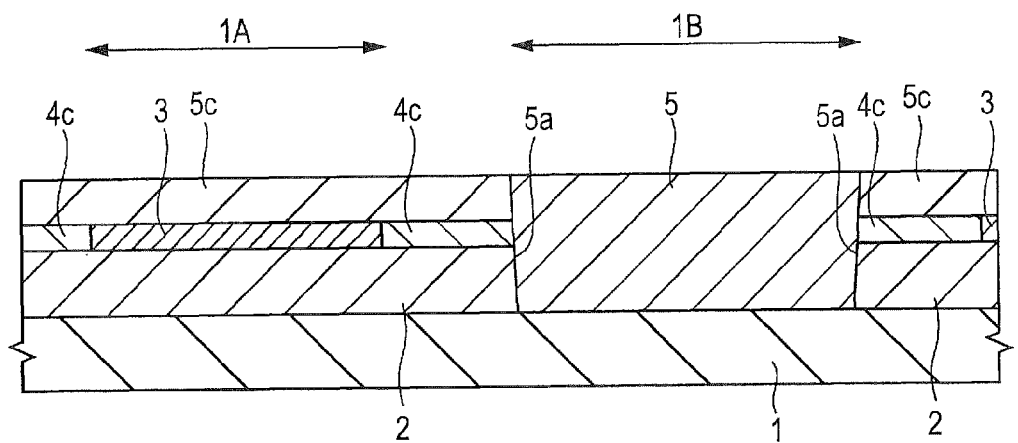
FIG. 29 is a sectional view illustrating the method of manufacturing the semiconductor device following FIG. 28.

Subsequently, as illustrated in FIG. 29, the epitaxial layer 5 is formed in the opening 5a by being selectively grown from the upper surface of the semiconductor substrate 1 with an epitaxial growth process. The epitaxial layer 5 is formed to fill the opening 5a and to reach a position that is higher than those of the silicon layers 3 and 3d and lower than that of the upper surface of the silicon nitride film 5d (see FIG. 28).

Subsequently, the upper surface of the epitaxial layer 5 is flattened by using, for example, a CMP process, and the upper surface of the silicon nitride film 5d is also polished in this step. In this case, the silicon nitride film 5d is not completely removed and the upper surface of the silicon oxide film 5c is not exposed. The silicon nitride film 5d is then removed by using a wet etching process, etc. Herein, the upper surface of the silicon oxide film 5c and that of the epitaxial layer 5 are illustrated to be located at positions the same as each other and to be flat, in FIG. 29, but a level difference is sometimes caused between the upper surface of the silicon oxide film 5c and that of the epitaxial layer 5.

Figure 30:
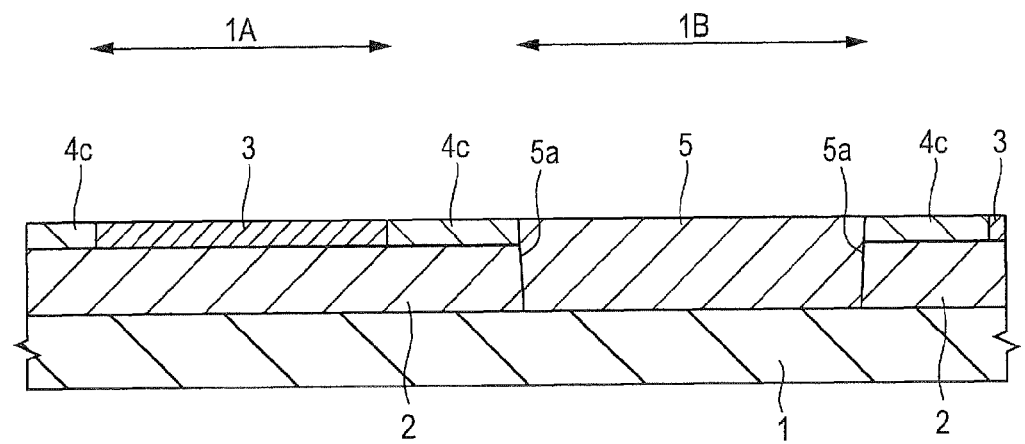
FIG. 30 is a sectional view illustrating the method of manufacturing the semiconductor device following FIG. 29.

Subsequently, as illustrated in FIG. 30, the silicon oxide film 5c is removed by performing an etch-back process, so that the upper surface of each of the silicon layer 3 and the element isolation region 4c is exposed. Herein, the upper surface of the silicon layer 3 and that of the epitaxial layer 5 are illustrated to be located at positions the same as each other and to be flat, in FIG. 30, but a level difference is sometimes caused between the upper surface of the silicon layer 3 and that of the epitaxial layer 5.

However, the distance of the level difference is smaller than the thickness of the silicon nitride film 5d (see FIG. 27), and when the distance thereof is approximately 70 nm or less, a state of being out of focus is a negligible degree, even if a photoresist film is exposed in the steps for manufacturing a semiconductor device. Accordingly, it is not needed to perform exposure steps in the SOI region 1A and the bulk silicon region 1B separately from each other, thereby allowing the steps for manufacturing a semiconductor device to be simplified.

In addition, if a polishing process, such as a CMP process, is used in exposing the upper surface of the silicon layer 3, there is the problem that: the upper surface of the silicon layer 3 may be damaged and a defect may be caused over the upper surface of the silicon layer 3, and hence the properties of an element, such as a MOSFET formed in the SOI region 1A, may be deteriorated or varied. On the other hand, in the steps for manufacturing a semiconductor device according to the present embodiment, an etching process is used in the step for exposing the upper surface of the silicon layer 3, not a CMP process, and hence it can be prevented that a defect may be caused over the upper surface of the silicon layer 3.

Figure 31:
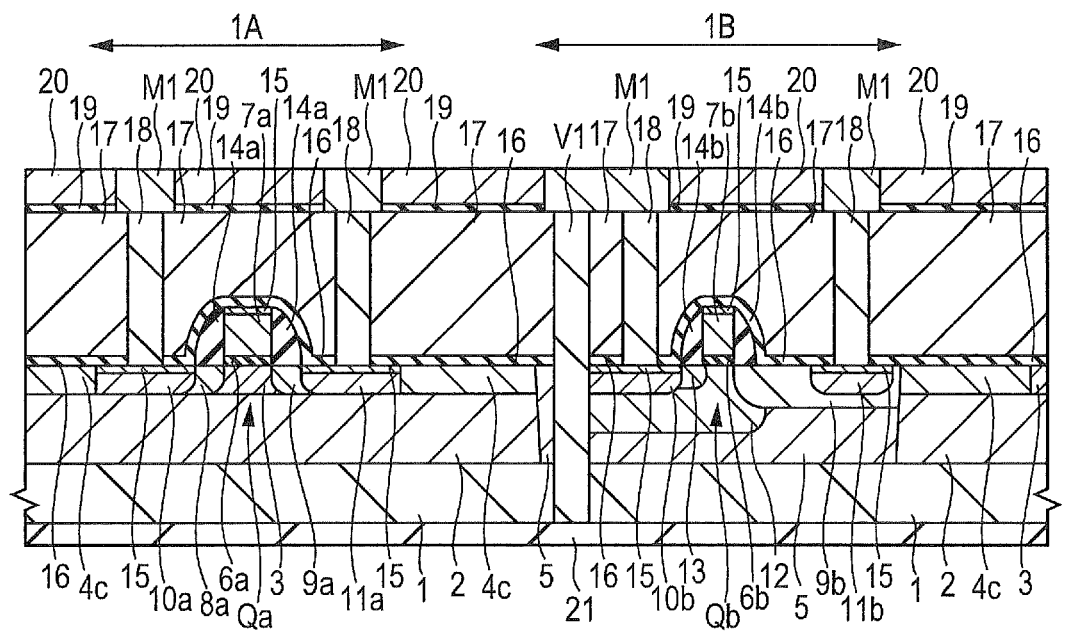
FIG. 31 is a sectional view illustrating the method of manufacturing the semiconductor device following FIG. 30.
Figure 32:
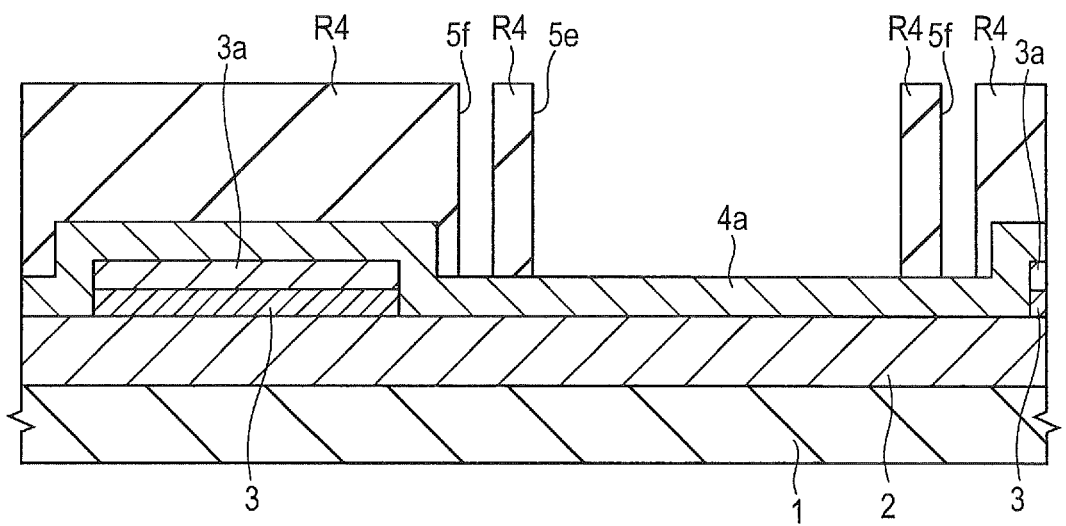
FIG. 32 is a sectional view illustrating a method of manufacturing a semiconductor device according to Fifth Embodiment of the invention.

By performing the following steps similar to those described with reference to FIGS. 8 to 16, the semiconductor device illustrated in FIG. 31 is completed. The semiconductor device illustrated in FIG. 31 has a structure similar to that of the semiconductor device illustrated in FIG. 1.

In the present embodiment, both ends of the opening of the silicon nitride film 5d are arranged immediately over the element isolation region 4c, as illustrated in FIG. 27, and hence, when the opening 5a is formed by using the silicon nitride film 5d as a mask, the element isolation region 4c is exposed to the internal wall of the opening 5a, not the silicon layer, as illustrated in FIG. 28.

On the other hand, in the step described with reference to FIG. 27, if both ends of the opening of the silicon nitride film 5d are arranged immediately over the silicon layer 3d, the silicon layer 3d is exposed to the internal wall of the opening 5a illustrated in FIG. 28. Thus, in the step described with reference to FIG. 27, when the size of the opening of the silicon nitride film 5d is made smaller than that of the silicon layer 3d immediately below the film 5d, and when the silicon layer 3 is made left adjacently to the internal wall of the opening 5a formed in the etching step described with reference to FIG. 28, the crystallinity of the upper portion of the epitaxial layer can be enhanced in the same way as in the aforementioned Third Embodiment.

(Fifth Embodiment)

In the present embodiment, both a method of manufacturing a semiconductor device in which, in forming an epitaxial layer to be formed in a bulk silicon region, it can be prevented that part of the upper surface of the epitaxial layer may rise and hence the upper surface thereof can be uniformly formed, and the semiconductor device will be described.

Figure 35:
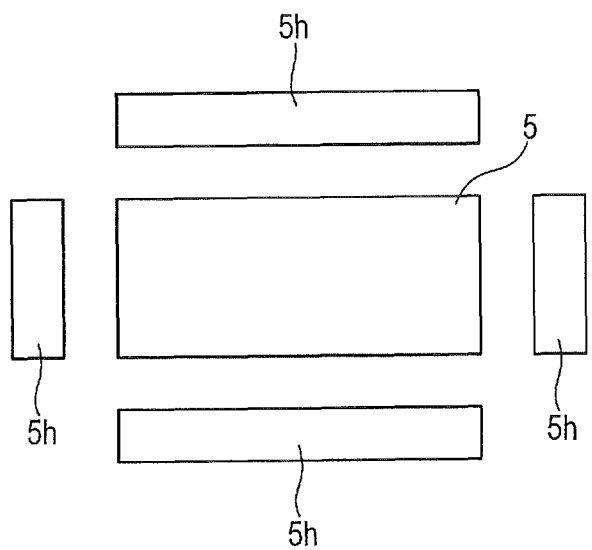
FIG. 35 is a view illustrating a layout of an epitaxial layer in the semiconductor device according to Fifth Embodiment of the invention.
Figure 36:
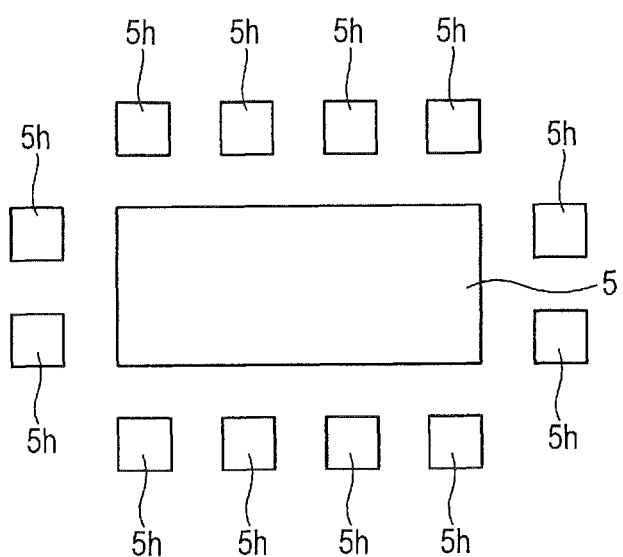
FIG. 36 is a view illustrating a layout of a variation of the epitaxial layer in the semiconductor device according to Fifth Embodiment of the invention.

Steps for manufacturing the semiconductor device according to the present embodiment will be described with reference to FIGS. 32 to 37. FIGS. 32 to 34 and FIG. 37 are sectional views for explaining the steps for manufacturing the semiconductor device according to the embodiment. FIGS. 35 and 36 illustrate, when viewed planarly, layouts of an epitaxial layer in the semiconductor device according to the embodiment.

The SOI substrate, on which the steps described with reference to FIGS. 2 and 3 have been performed, is first provided, and the silicon oxide film 4a is then formed over the semiconductor device 1 by, for example, a CVD process. Subsequently, a photoresist film R4 having a predetermined shape is formed over the silicon oxide film 4a. The photoresist film R4 has both an opening 5e in a region where an epitaxial layer to be used as a bulk silicon region is to be formed, and a plurality of openings 5f each having, for example, a groove-shaped narrow shape, which are located around the opening 5e; but an opening is not provided immediately over a region where the silicon layer 3 to be used as an SOI region is formed.

Figure 33:
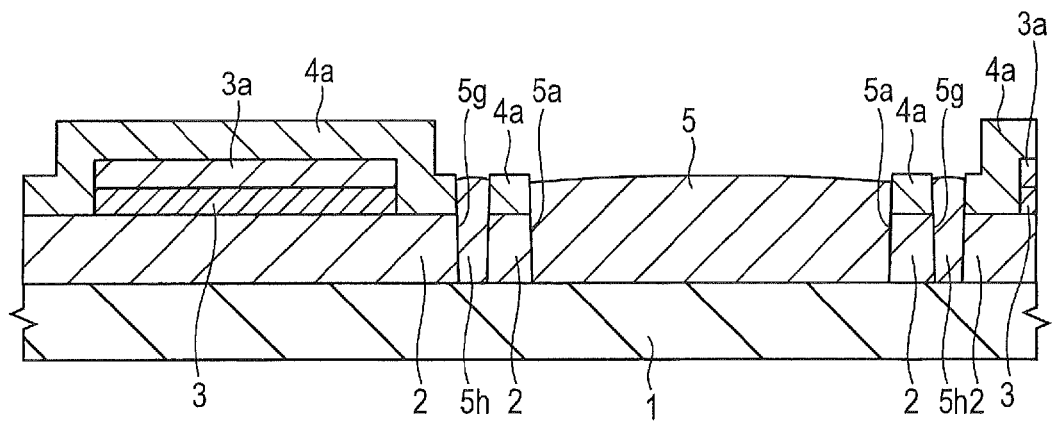
FIG. 33 is a sectional view illustrating the method of manufacturing the semiconductor device following FIG. 32.

Subsequently, after openings 5a and 5g, by which the upper surface of the semiconductor device 1 immediately below the openings 5e and 5f is exposed, are formed by performing steps similar to those described with reference to FIGS. 5 and 6 and by performing an etching step, the photoresist film R4 is removed, and subsequently the epitaxial layer 5 and an epitaxial layer 5h are formed by an epitaxial growth process, as illustrated in FIG. 33. The opening 5a is formed immediately below the opening 5e (see FIG. 32) and the opening 5g is formed immediately below the opening 5f (see FIG. 32). In addition, by epitaxial growth, the epitaxial layer 5 is formed in the opening 5a and the epitaxial layer 5h is formed in the opening 5g.

In this case, with the opening 5g smaller than the opening 5a being formed around the opening 5a, the whole upper surface of the epitaxial layer 5 can be formed more uniformly, without rising so as to protrude, in comparison with the case where the opening 5g is not provided. That is, in the present embodiment, the upper surface of the epitaxial layer 5 is formed to have a shape close to a flat surface.

When the opening 5g is not provided, the center of the epitaxial layer 5 is located at a position higher than of the end of the layer 5. When it is intended to form the end of the epitaxial layer 5 to a position higher than that of the silicon layer 3, there is the fear that the upper surface of the center thereof may reach a position higher than that of the uppermost surface of the silicon oxide film 4a. If the upper surface of the epitaxial layer 5 is formed to a position higher than that of the uppermost surface of the silicon oxide film 4a, there is the problem that a damage, such as occurrence of a crack in the epitaxial layer, may be caused in a later CMP process.

Accordingly, in the present embodiment, by forming the opening 5g around the opening 5a to make the epitaxial layer 5 in the opening 5a grow more uniformly, it is made possible that the upper surface of the epitaxial layer 5 is formed into a flatter shape. This is because: it can be prevented that the upper surface of the epitaxial layer 5 may partially rise, which is caused with a material gas for forming the epitaxial layer 5 being sucked into the opening 5g.

Thereby, it is made easy to form the whole upper surface of the epitaxial layer 5 at a position higher than that of the upper surface of the silicon layer 3 and to form the upper surface of the epitaxial layer 5 at a position lower than that of the silicon oxide film 4a. Accordingly, it can be prevented that the epitaxial layer 5 may be damaged in a later polishing step for flattening the upper surface of the epitaxial layer 5, thereby allowing the reliability of the semiconductor device to be improved. Herein, the epitaxial layer 5h is a dummy epitaxial layer over which a semiconductor element, etc., is not formed.

Figure 34:
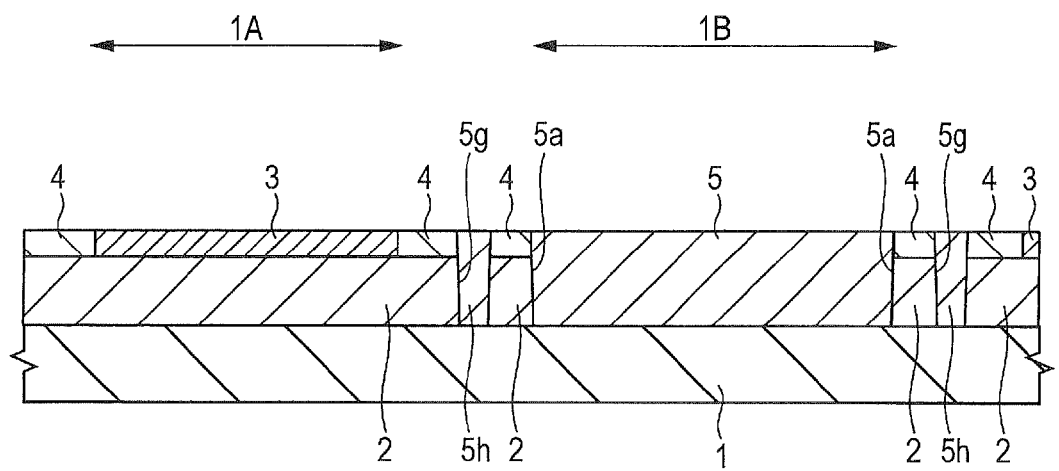
FIG. 34 is a sectional view illustrating the method of manufacturing the semiconductor device following FIG. 33.

Subsequently, as illustrated in FIG. 34, the surface of each of the epitaxial layers 5 and 5h is flattened in the same way as in the step described with reference to FIG. 7, after the upper surface of the silicon layer 3 is exposed by removing the silicon nitride film 3a with the use of, for example, a CMP process. With this, the upper portion of the silicon oxide film 4a is polished, thereby allowing the element isolation regions 4 comprised of the silicon oxide film 4a to be formed between the silicon layer 3 and the epitaxial layer 5h and between the epitaxial layer 5 and the epitaxial layer 5h.

Herein, a layout of the epitaxial layers 5 and 5h, when viewed planarly, is illustrated in FIG. 35. A variation of the layout of the epitaxial layers 5 and 5h is illustrated in FIG. 36. In FIGS. 35 and 36, the epitaxial layers 5 and 5h are only illustrated, and the element isolation region around the epitaxial layers, and other elements are not illustrated.

As illustrated in FIG. 35, the epitaxial layer 5h having a rectangular shape, which is surrounded by the element isolation region 4 (see FIG. 34), is formed near to each of four sides of the epitaxial layer 5 having a rectangular shape, when viewed planarly. Each epitaxial layer 5h extends along one side of the adjacent epitaxial layer 5, and the four epitaxial layers 5h are arranged so as to surround the epitaxial layer 5.

Also, as illustrated FIG. 36, a plurality of the epitaxial layers 5h, each of which is surrounded by the element isolation region 4 (see FIG. 34) and has a rectangular shape, are formed near to each of four sides of the epitaxial layer 5 having a rectangular shape, when viewed planarly. The epitaxial layers 5h are arranged side by side along one side of the adjacent epitaxial layer 5. Herein, the shape of the epitaxial layer 5h is a square, when viewed planarly. Thus, the epitaxial layers 5h may be formed into an island pattern.

As illustrated in FIGS. 35 and 36, by forming the epitaxial layers 5h so as to surround the epitaxial layer 5, when viewed planarly, the upper surface of the epitaxial layer 5 can be formed to be located at a further uniform height in the step for manufacturing the epitaxial layer 5.

Figure 37:
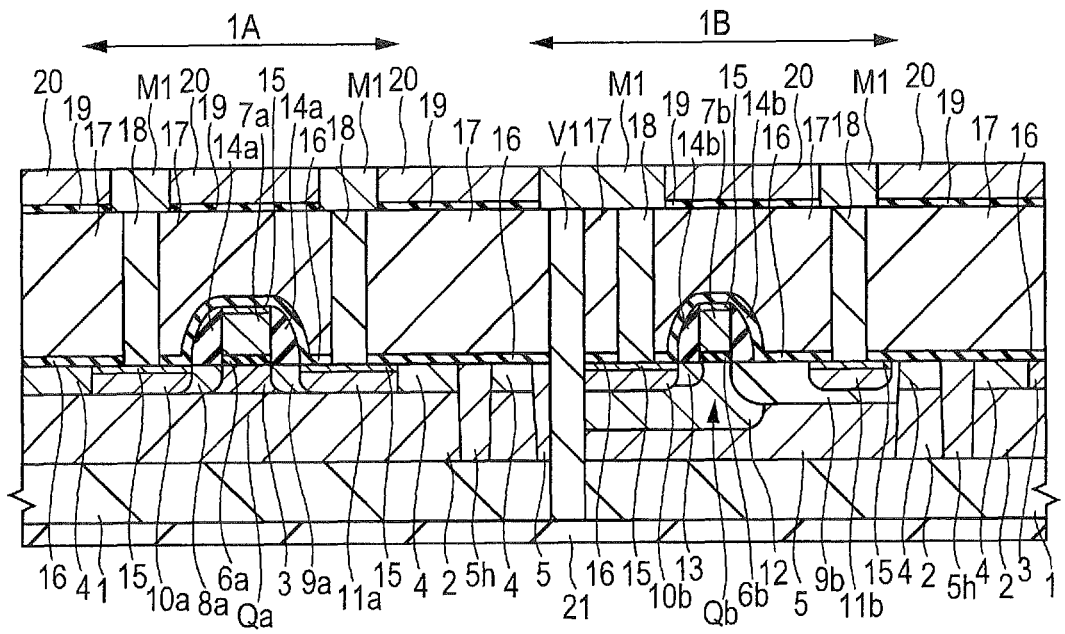
FIG. 37 is a sectional view illustrating the method of manufacturing the semiconductor device following FIG. 34.

By performing the following steps similar to those described with reference to FIGS. 8 to 16, the semiconductor device illustrated in FIG. 37 is completed. Herein, in the ion implantation step described with reference to FIG. 8, an impurity ion shall not be implanted into the upper surface of the epitaxial layer 5h. However, as a variation of the steps for manufacturing a semiconductor device according to the present embodiment, a p-type semiconductor region 12a may be formed by driving a p-type impurity (e.g., B (boron)) into the upper surface of the epitaxial layer 5h with the use of an ion implantation process, in a step corresponding to the ion implantation step described with reference to FIG. 8, as illustrated in the sectional view in FIG. 38.

Figure 38:
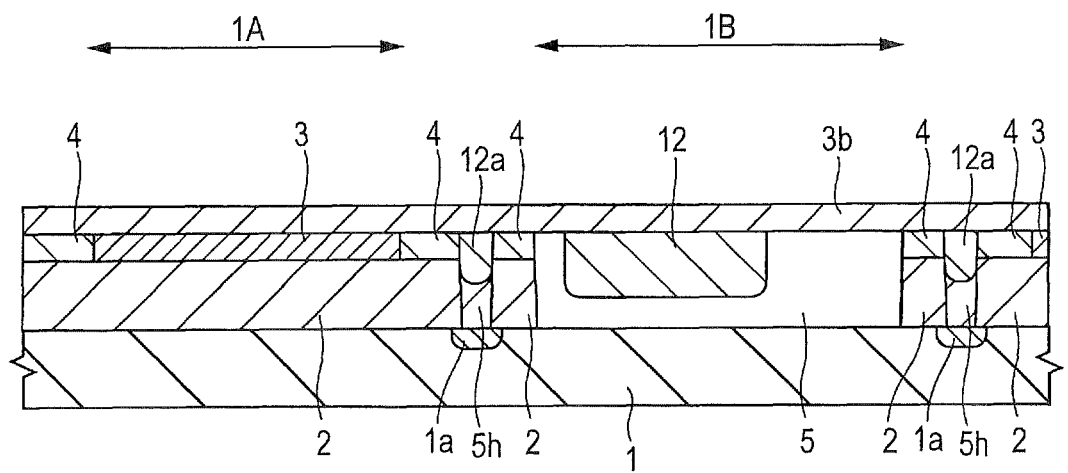
FIG. 38 is a sectional view illustrating a variation of the method of manufacturing the semiconductor device according to Fifth Embodiment of the invention.

Alternatively, as illustrated in FIG. 38, a diffusion layer 1a may be formed by driving a relatively high-concentration of p-type impurities (e.g., B (boron)) into the upper surface of the semiconductor device 1 immediately below the opening 5g. As a method of forming the diffusion layer 1a, a method of driving an impurity ion into the upper surface of the semiconductor device 1 from the upside of the semiconductor device 1 and the BOX film by using a photolithography technique and an ion implantation process, for example, in the manufacturing step described with reference to FIG. 2 of FIG. 7.

By forming the p-type semiconductor region 12a or the diffusion layer 1a, an electric field can be reduced and hence it can be prevented that a noise may be caused in a MOSFET.

The invention made by the present inventors has been specifically described above based on preferred embodiments; however, the invention should not be limited to the preferred embodiments, and it is needless to say that the invention may be modified variously within a range not departing from the gist thereof.

For example, the contact plug 24 illustrated in FIG. 24 may be formed in the semiconductor device described in the aforementioned First Embodiment, Second Embodiment, Third Embodiment, Fourth Embodiment, and Fifth Embodiment.

In addition, the case where an n-channel type MOSFET is formed over a semiconductor substrate has been described in each of First Embodiment to Fifth Embodiment; however, a semiconductor element to be formed in an SOI region or a bulk silicon region may be a p-channel type MOSFET, or may be a semiconductor element other than a field effect transistor.

This invention is widely used in a semiconductor device having a semiconductor element formed over a SOI substrate.

What is claimed is:

1. A method of manufacturing a semiconductor device comprising:
    providing a semiconductor substrate that is comprised of: a supporting substrate; a first insulating film formed over the supporting substrate; and a semiconductor layer formed over the first insulating film, and that includes a first region and a second region over the upper surface of the semiconductor layer;
    exposing the upper surface of the first insulating film in the second region by forming a second insulating film over the semiconductor layer and by processing the semiconductor layer with the use of the second insulating film as a mask;
    forming a third insulating film so as to cover the semiconductor layer, the second insulating film, and the first insulating film;
    exposing the upper surface of the supporting substrate by opening the third insulating film and the first insulating film in the second region;
    forming a first epitaxial layer in the opening of the first insulating film and the third insulating film;
    exposing the upper surface of the semiconductor layer by polishing the first epitaxial layer, the third insulating film, and the second insulating film; and
    after the exposing of the upper surface of the semiconductor layer, forming a semiconductor element over each of the semiconductor layer in the first region and the first epitaxial layer in the second region.

2. The method of manufacturing a semiconductor device according to claim 1,
    wherein, in the exposing of the upper surface of the semiconductor layer, the second insulating film is used as a stopper film for polishing.

3. The method of manufacturing a semiconductor device according to claim 1,
    wherein the semiconductor layer and the first epitaxial layer are spaced apart from each other by 5 µm or more.

4. The method of manufacturing a semiconductor device according to claim 3,
    wherein a digital circuit and an analog circuit are formed in the first region, and
    wherein a high-frequency analog circuit of 10 kHz or more is formed in the second region.

5. The method of manufacturing a semiconductor device according to claim 4,
    wherein the semiconductor element formed in the second region includes an LDMOSFET (Laterally Diffused Metal Oxide Semiconductor Field Effect Transistor) in which impurities are diffused in the direction along the upper surface of the first epitaxial layer.

6. The method of manufacturing a semiconductor device according to claim 1,
    wherein, in the exposing of the upper surface of the supporting substrate, the upper surface of the supporting substrate is exposed by forming a plurality of grooves around the opening of the third insulating film and the first insulating film in the second region, and
    wherein, in the forming of the first epitaxial layer, the first epitaxial layer is formed in the opening of the first insulating film and the third insulating film and a second epitaxial layer is formed in the grooves.

7. A method of manufacturing a semiconductor device comprising:

providing a semiconductor substrate that is comprised of: a supporting substrate; a first insulating film formed over the supporting substrate; and a semiconductor layer formed over the first insulating film, and that includes a first region and a second region over the upper surface of the semiconductor layer, and forming a second insulating film over the semiconductor layer;

flattening the upper surface of each of the second insulating film and a third insulating film, after the third insulating film is embedded in a groove formed by removing both the semiconductor layer and the second insulating film between the first region and the second region;

after the flattening of the upper surface of each of the second insulating film and the third insulating film, exposing the upper surface of the supporting substrate by opening, in the second region, the second insulating film, the semiconductor layer, and the first insulating film such that both ends of the semiconductor layer in the second region are left;

forming an epitaxial layer in the opening of the first insulating film and the semiconductor layer;

exposing the upper surface of the semiconductor layer by polishing the epitaxial layer, the third insulating film, and the second insulating film; and after the exposing of the upper surface of the semiconductor layer, forming a semiconductor element over each of the semiconductor layer in the first region and the epitaxial layer in the second region.

8. The method of manufacturing a semiconductor device according to claim 7 further comprising of, before the flattening of the upper surface of each of the second insulating film and the third insulating film, forming a fourth insulating film over the second insulating film, wherein, in the exposing of the upper surface of the supporting substrate by opening, the upper surface of the supporting substrate is exposed by opening, in the second region, the fourth insulating film, the second insulating film, the semiconductor layer, and the first insulating film such that both ends of the semiconductor layer in the second region are left, and wherein, in the forming of the epitaxial layer, the upper surface of the epitaxial layer reaches the height of the fourth insulating film.

9. The method of manufacturing a semiconductor device according to claim 7, wherein, in the exposing the upper surface of the semiconductor layer, the second insulating film is used as a stopper film for polishing.

10. The method of manufacturing a semiconductor device according to claim 7, wherein the semiconductor layer and the epitaxial layer are spaced apart from each other by 5 μm or more.

11. The method of manufacturing a semiconductor device according to claim 10, wherein a digital circuit and an analog circuit are formed in the first region, and wherein a high-frequency analog circuit of 10 kHz or more is formed in the second region.

12. The method of manufacturing a semiconductor device according to claim 11, wherein the semiconductor element formed in the second region includes an LDMOSFET (Laterally Diffused Metal Oxide Semiconductor Field Effect Transistor) in which impurities are diffused in the direction along the upper surface of the epitaxial layer.

13. A method of manufacturing a semiconductor device comprising:

providing a semiconductor substrate that is formed by: a supporting substrate; a first insulating film formed over the supporting substrate; and a semiconductor layer formed over the first insulating film, and that includes a first region and a second region over the upper surface of the semiconductor layer;

forming an element isolation region in a groove formed by removing the semiconductor layer between the first region and the second region;

forming a third insulating film, which has a first opening in the second region, over each of the semiconductor layer and the element isolation region;

exposing the upper surface of the supporting substrate by providing a second opening in the second region with the use of the third insulating film as a mask;

forming an epitaxial layer in the second opening;

exposing the upper surface of the semiconductor layer by polishing the epitaxial layer and the third insulating film; and after the exposing of the upper surface of the semiconductor layer, forming a semiconductor element over each of the semiconductor layer in the first region and the epitaxial layer in the second region.

14. The method of manufacturing a semiconductor device according to claim 13 further comprising, after the forming of the element isolation region and before the forming of the third insulating film, forming a second insulating film over each of the semiconductor layer and the element isolation region, wherein, in the forming of the third insulating film, the third insulating film is formed over the second insulating film.

15. The method of manufacturing a semiconductor device according to claim 13, wherein the semiconductor layer and the epitaxial layer are spaced apart from each other by 5 μm or more.

16. The method of manufacturing a semiconductor device according to claim 15, wherein a digital circuit and an analog circuit are formed in the first region, and wherein a high-frequency analog circuit of 10 kHz or more is formed in the second region.

17. The method of manufacturing a semiconductor device according to claim 16, wherein the semiconductor element formed in the second region includes an LDMOSFET (Laterally Diffused Metal Oxide Semiconductor Field Effect Transistor) in which impurities are diffused in the direction along the upper surface of the epitaxial layer.

18. The method of manufacturing a semiconductor device according to claim 13, wherein both ends of the first opening of the third insulating film, which is formed in the forming the third insulating film, are located immediately over the element isolation region, and wherein the element isolation region is exposed to the internal wall of the second opening formed in the exposing of the upper surface of the supporting substrate.

19. The method of manufacturing a semiconductor device according to claim 13, wherein both ends of the first opening of the third insulating film formed in the forming of the third insulating film are located immediately over the semiconductor layer, and wherein the semiconductor layer is exposed to the internal wall of the second opening formed in the exposing of the upper surface of the supporting substrate.

* * * * *